United States Patent [19]
Bloker et al.

[11] Patent Number: 5,864,251
[45] Date of Patent: Jan. 26, 1999

[54] METHOD AND APPARATUS FOR SELF-RESETTING LOGIC CIRCUITRY

[75] Inventors: Raymond E. Bloker, San Jose; Ashish Pancholy, Santa Clara; Gary A. Gibbs, San Jose, all of Calif.

[73] Assignee: Cypress Semiconductor Corporation, San Jose, Calif.

[21] Appl. No.: 791,002

[22] Filed: Jan. 27, 1997

Related U.S. Application Data

[63] Continuation of Ser. No. 676,888, Jul. 8, 1996, abandoned, which is a continuation of Ser. No. 330,930, Oct. 28, 1994, abandoned.

[51] Int. Cl.$^6$ ................................................ H03K 3/017
[52] U.S. Cl. ...................... 327/172; 327/173; 327/174; 327/198; 327/227; 327/230
[58] Field of Search ...................... 327/134, 172, 327/174, 176, 198, 227, 395, 230, 173, 175

[56] References Cited

U.S. PATENT DOCUMENTS

| | | | |
|---|---|---|---|
| 4,767,947 | 8/1988 | Shah | 327/230 |
| 4,845,385 | 7/1989 | Ruth, Jr. . | |
| 4,985,643 | 1/1991 | Proebsting . | |
| 5,039,875 | 8/1991 | Chang | 327/143 |
| 5,151,614 | 9/1992 | Yamazaki et al. | 327/143 |
| 5,163,168 | 11/1992 | Hirano et al. | 327/176 |
| 5,172,012 | 12/1992 | Ueda | 327/143 |
| 5,177,375 | 1/1993 | Ogawa et al. | 327/143 |
| 5,218,237 | 6/1993 | Mao | 327/176 |
| 5,321,317 | 6/1994 | Pascucci et al. | 327/143 |
| 5,396,110 | 3/1995 | Houston | 327/172 |

FOREIGN PATENT DOCUMENTS

| | | | |
|---|---|---|---|
| 60-85498 | 5/1985 | Japan | 327/143 |
| 4-129416 | 4/1992 | Japan | 327/143 |

OTHER PUBLICATIONS

Bonges, H.A., III, et al., "A 576K 3.5–ns Access BiCMOS ECL Static Ram with Array Built–in Self–Test,"*IEEE Journal of Solid–State Circuits*, vol. 27, No. 4, pp. 649–656 (Apr. 1992).

Chappell, T.I., et al., "A 2–ns Cycle, 3.8–ns Access 512 kb CMOS ECL SRAM with a Fully Pipelined Architecture, "*IEEE Journal of Solid–State Circuits*, vol. 26, No. 11, pp. 1577–1585 (Nov. 1991).

Childs, L.F., et al., "An 18ns 4K×4 CMOS SRAM,"*IEEE Journal of Solid–State Circuits*, vol. SC–19, No. 5, pp. 545–551 (Oct. 1984).

Wendell, D., et al., "A 3.5ns, 2K×9 Self Timed SRAM," *1990 Symposium on VLSI Circuits*, pp. 49–50 (1990).

*Primary Examiner*—Terry Cunningham
*Attorney, Agent, or Firm*—Blakely, Sokoloff, Taylor & Zafman

[57] ABSTRACT

A self-resetting logic stage provides for a relatively faster propagation of pulse signals and for relatively less power consumption. For a self-resetting logic stage in a digital logic path of successive logic stages, a forward path creates the forward edge for an output pulse signal and a reset path creates a reset or trailing edge for the output pulse signal. The propagation delay for the reset path may be increased for successive stages in the logic path to minimize or avoid overlap current. As the increased propagation delay increases the width of a pulse signal as the pulse signal propagates from stage to stage, logic stages in the logic path may be configured to reduce the width of the pulse signal, for example when the pulse signal approaches a width that may limit the cycle time for the logic path. Logic stages in the logic path may also be configured to provide for relatively quicker reset recovery to minimize any increase in cycle time.

18 Claims, 16 Drawing Sheets

5,864,251

METHOD AND APPARATUS FOR SELF-RESETTING LOGIC CIRCUITRY

This is a continuation of application Ser. No. 08/676,888, filed Jul. 8, 1996, now abandoned, which is a continuation of application Ser. No. 08/330,930, filed Oct. 28, 1994, now abandoned.

BACKGROUND OF THE INVENTION

1. Field of the Invention

The present invention relates generally to the field of electrical devices. More particularly, the present invention relates to the field of digital logic gates.

2. Description of the Related Art

Complementary Metal Oxide Semiconductor (CMOS) circuits are well known in the Integrated Circuit (IC) industry and typically include many CMOS stages configured together in a digital logic path. A typical CMOS stage includes a pull-up path and a pull-down path coupled in series between a high voltage source and a low voltage source. The pull-up path drives the output of the stage to the high voltage source to output a high or logical-one signal. The pull-down path drives the output of the stage to the low voltage source to output a low or logical-zero signal. As one example, the high and low voltage source levels may be approximately 3.3 Volts and approximately zero (0) Volts, respectively.

A typical CMOS stage switches its output from low to high by turning on the pull-up path while simultaneously turning off the pull-down path. Similarly, a typical CMOS stage switches its output from high to low by turning on the pull-down path while simultaneously turning off the pull-up path. Both paths, however, are partially on simultaneously for a finite amount of time while transitioning between on and off states, allowing current to flow between the high voltage source and the low voltage source.

This flow of current, commonly called overlap or crowbar current, represents wasted current that performs no useful work and results in increased power consumption for the stage. Overlap current may consume ten percent or more of the current consumed by the stage, reducing the amount of current available for the stage to drive its output. With less current available, the stage undergoes an increased delay in switching its output from low to high and from high to low.

Furthermore, both the pull-up path and the pull-down path for a typical CMOS stage are coupled to the input of the stage and present a load to any preceding CMOS stage even though only one of the paths is actually driving the stage output. This increased loading results in an increased delay for any preceding stage in switching its output from low to high and from high to low.

The fanout of stages, that is the ratio of the channel width size of the driven device or devices to the channel width size of the driving device or devices, may be appropriately adjusted to reduce the delay that results from such increased loading. However, any increase in size for driving and/or driven devices to reduce this delay may result in increased current consumption. Any increase in device size may also require relatively more layout area.

Self-resetting logic circuits may provide for relatively faster switching times and relatively less current consumption as compared to typical CMOS circuits.

U.S. Pat. No. 4,985,643 by Proebsting, entitled SPEED ENHANCEMENT TECHNIQUE FOR CMOS CIRCUITS, disclosed one self-resetting logic circuit. In a series of logic stages, nodes in the signal path of a pulse are set by preceding logic stages, then reset by feedback from subsequent logic stages. The width of the pulse propagating from stage to stage in the signal path remains substantially constant.

For the self-resetting logic circuit of Proebsting, however, the feedback delay for each stage must be nearly identical to avoid overlap current and realize a speed increase over typical CMOS circuits. As the propagation delay of any inverter gate in the feedback path varies depending on such factors as the proximity of each inverter gate to any previous inverter gate, any differences in the power supply voltage for each inverter gate, and any noise in the power supply, ensuring nearly identical feedback delay for each stage may be difficult. When an overlap current condition occurs for one stage, overlap current results for subsequent stages as any timing problem encountered in one stage is propagated to the next stage. A domino effect may result as successive stages undergo similar or worse timing problems, causing the circuit to fail from excessive power consumption.

BRIEF SUMMARY AND OBJECTS OF THE INVENTION

One of the objects of the present invention is to provide for relatively more robust self-resetting logic circuitry.

Another object of the present invention is to provide for self-resetting logic circuitry that consumes relatively less current.

Another object of the present invention is to provide for self-resetting logic circuitry that propagates pulse signals relatively faster.

A method for propagating a pulse signal is described. A forward edge of a first pulse signal is received. A forward edge of a second pulse signal is outputted in response to the forward edge of the first pulse signal. A trailing edge of the second pulse signal is outputted after a first predetermined period of time following the output of the forward edge of the second pulse signal. A forward edge of a third pulse signal is outputted in response to the forward edge of the second pulse signal. A trailing edge of the third pulse signal is outputted after a second predetermined period of time greater than the first predetermined period of time following the output of the forward edge of the third pulse signal.

A method for outputting a second pulse signal in response to a first pulse signal is also described. A forward edge of a first pulse signal is received. A forward edge of a second pulse signal is outputted in response to the forward edge of the first pulse signal. The forward edge of the second pulse signal is delayed for a period of time to produce a delayed forward edge. A trailing edge of the second pulse signal is outputted in response to the delayed forward edge such that the second pulse signal is less in width than the first pulse signal.

A method for outputting a second pulse signal in response to a first pulse signal is further described. A forward edge of a first pulse signal is received. A forward edge of a second pulse signal is outputted in response to the forward edge of the first pulse signal. A trailing edge of the second pulse signal is outputted after a first predetermined period of time following the output of the forward edge of the second pulse signal. After a second predetermined period of time less than the first predetermined period of time following the output of the trailing edge of the second pulse signal, a resetting operation is performed for receipt of another pulse signal.

An apparatus for propagating a pulse signal is described. The apparatus includes first circuitry for receiving a forward edge of a first pulse signal and for outputting a forward edge of a second pulse signal in response to the forward edge of the first pulse signal. The apparatus also includes second circuitry for outputting a trailing edge of the second pulse signal after a first predetermined period of time following the output of the forward edge of the second pulse signal. The apparatus further includes third circuitry for outputting a forward edge of a third pulse signal in response to the forward edge of the second pulse signal and fourth circuitry for outputting a trailing edge of the third pulse signal after a second predetermined period of time greater than the first predetermined period of time following the output of the forward edge of the third pulse signal.

An apparatus for outputting a second pulse signal in response to a first pulse signal is also described. The apparatus includes first circuitry for receiving a forward edge of a first pulse signal and for outputting a forward edge of a second pulse signal in response to the forward edge of the first pulse signal. The apparatus also includes second circuitry for delaying the forward edge of the second pulse signal for a period of time to produce a delayed forward edge. The apparatus further includes third circuitry for outputting a trailing edge of the second pulse signal in response to the delayed forward edge such that the second pulse signal is less in width than the first pulse signal.

An apparatus for outputting a second pulse signal in response to a first pulse signal is further described. The apparatus includes first circuitry for receiving a forward edge of a first pulse signal and for outputting a forward edge of a second pulse signal in response to the forward edge of the first pulse signal. The apparatus also includes second circuitry for outputting a trailing edge of the second pulse signal after a first predetermined period of time following the output of the forward edge of the second pulse signal. The apparatus further includes third circuitry for resetting the apparatus, after a second predetermined period of time less than the first predetermined period of time following the output of the trailing edge of the second pulse signal, for receipt of another pulse signal.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

The following detailed description sets forth an embodiment or embodiments in accordance with the present invention for a method and apparatus for self-resetting logic circuitry. In the following description, details are set forth such as specific circuitry configurations, channel widths, etc., in order to provide a thorough understanding of the present invention. It will be evident, however, that the present invention may be practiced without these details. In other instances, the functioning of well-known circuit components, logic gates, etc., have not been described in particular detail so as not to obscure the present invention.

Figure 1:
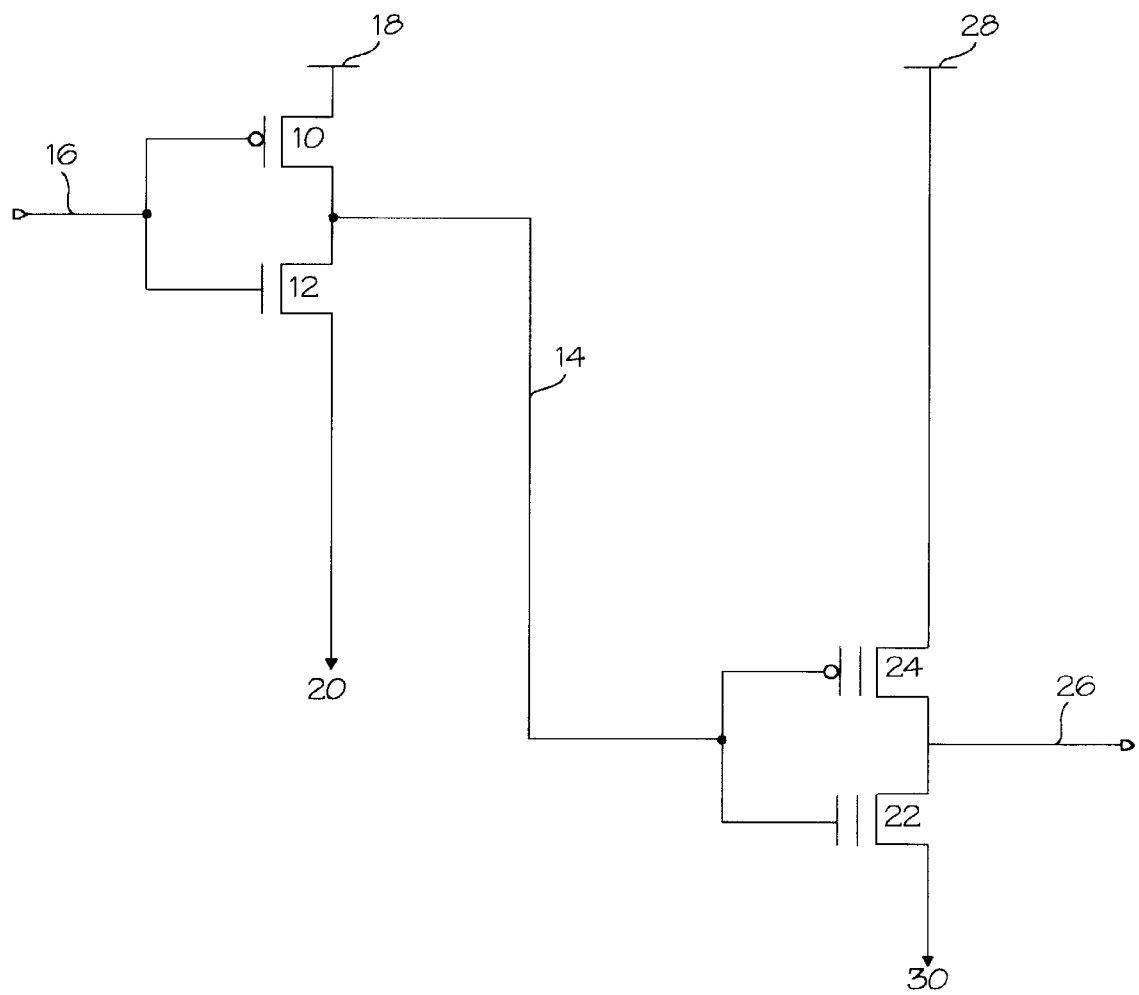
FIG. 1 illustrates circuitry for two prior CMOS inverter stages.

FIG. 1 illustrates circuitry for two prior CMOS stages that function as inverters. This circuitry includes voltage terminals 18, 20, 28, and 30. The voltage level for voltage terminals 18 and 28 may be approximately 3.3 Volts, for example, and may represent a high or logical-one voltage level. The voltage level for voltage terminals 20 and 30 may be approximately zero (0) Volts, for example, and may represent a low or logical-zero voltage level. Other suitable voltage levels may also be used for voltage terminals 18, 20, 28, and 30.

For this detailed description, the terms low and high refer to voltage levels representative of logical-zero and logical-one voltage levels, respectively. Any suitable voltage level may be used to represent the low or logical-zero voltage level and to represent the high or logical-one voltage level.

The first inverter stage for the circuitry of FIG. 1 includes a p-channel Metal Oxide Semiconductor (PMOS) transistor 10, an n-channel Metal Oxide Semiconductor (NMOS) transistor 12, an input node 16, and an output node 14.

For this detailed description, the terms NMOS transistor and PMOS transistor encompass any suitable n-channel and p-channel Field Effect Transistor (FET), respectively.

The drain, gate, and source of transistor 10 are coupled to output node 14, input node 16, and voltage terminal 18, respectively. Transistor 10 creates a pull-up path for the first inverter stage and couples output node 14 to voltage terminal 18 when input node 16 is driven low. The drain, gate, and source of transistor 12 are coupled to output node 14, input node 16, and voltage terminal 20, respectively. Transistor 12 creates a pull-down path for the first inverter stage and couples output node 14 to voltage terminal 20 when input node 16 is driven high.

The second inverter stage for the circuitry of FIG. 1 includes an NMOS transistor 22, a PMOS transistor 24, and an output node 26. Node 14 is an input node for this second inverter stage.

The drain, gate, and source of transistor 24 are coupled to output node 26, node 14, and voltage terminal 28, respectively. Transistor 24 creates a pull-up path for the second inverter stage and couples output node 26 to voltage terminal 28 when node 14 is driven low. The drain, gate, and source of transistor 22 are coupled to output node 26, node 14, and voltage terminal 30, respectively. Transistor 22 creates a pull-down path for the second inverter stage and couples output node 26 to voltage terminal 30 when node 14 is driven high.

Each CMOS stage of FIG. 1 switches its output node from low to high by turning on its pull-up path while simultaneously turning off its pull-down path. Similarly, each CMOS stage of FIG. 1 switches its output node from high to low by turning on its pull-down path while simultaneously turning off its pull-up path. As one example, transistor 12 is turned on and transistor 10 is simultaneously turned off when input node 16 is driven high by a preceding logic stage. Node 14 is pulled low by transistor 12, turning on transistor 24 while simultaneously turning off transistor 22. Node 26 is then pulled high by transistor 24.

Transistors 10 and 12, however, are both partially on simultaneously for a finite amount of time while transitioning between on and off states, allowing current to flow between voltage terminals 18 and 20. Similarly, transistors 22 and 24 are both partially on simultaneously for a finite amount of time while transitioning between on and off states, allowing current to flow between voltage terminals 28 and 30.

This flow of current, commonly called overlap or crowbar current, represents wasted current that performs no useful work and results in increased power consumption for each stage. Overlap current may consume ten percent or more of the current consumed by each stage, reducing the amount of current available for the stage to drive its output node. With less current available, each stage undergoes an increased delay in switching its output node from low to high and from high to low.

Furthermore, both the pull-up path and the pull-down path for each CMOS stage are coupled to the input of the stage and present a load to any preceding stage even though only one of the paths is actually driving the stage output node. This increased loading results in an increased delay for any preceding stage in switching its output node from low to high and from high to low.

The fanout of stages, that is the ratio of the channel width size of the driven device or devices to the channel width size of the driving device or devices, may be appropriately adjusted to reduce the delay that results from such increased loading. However, any increase in size for driving and/or driven devices to reduce this delay may result in increased current consumption. Any increase in device size may also require relatively more layout area.

Figure 2:
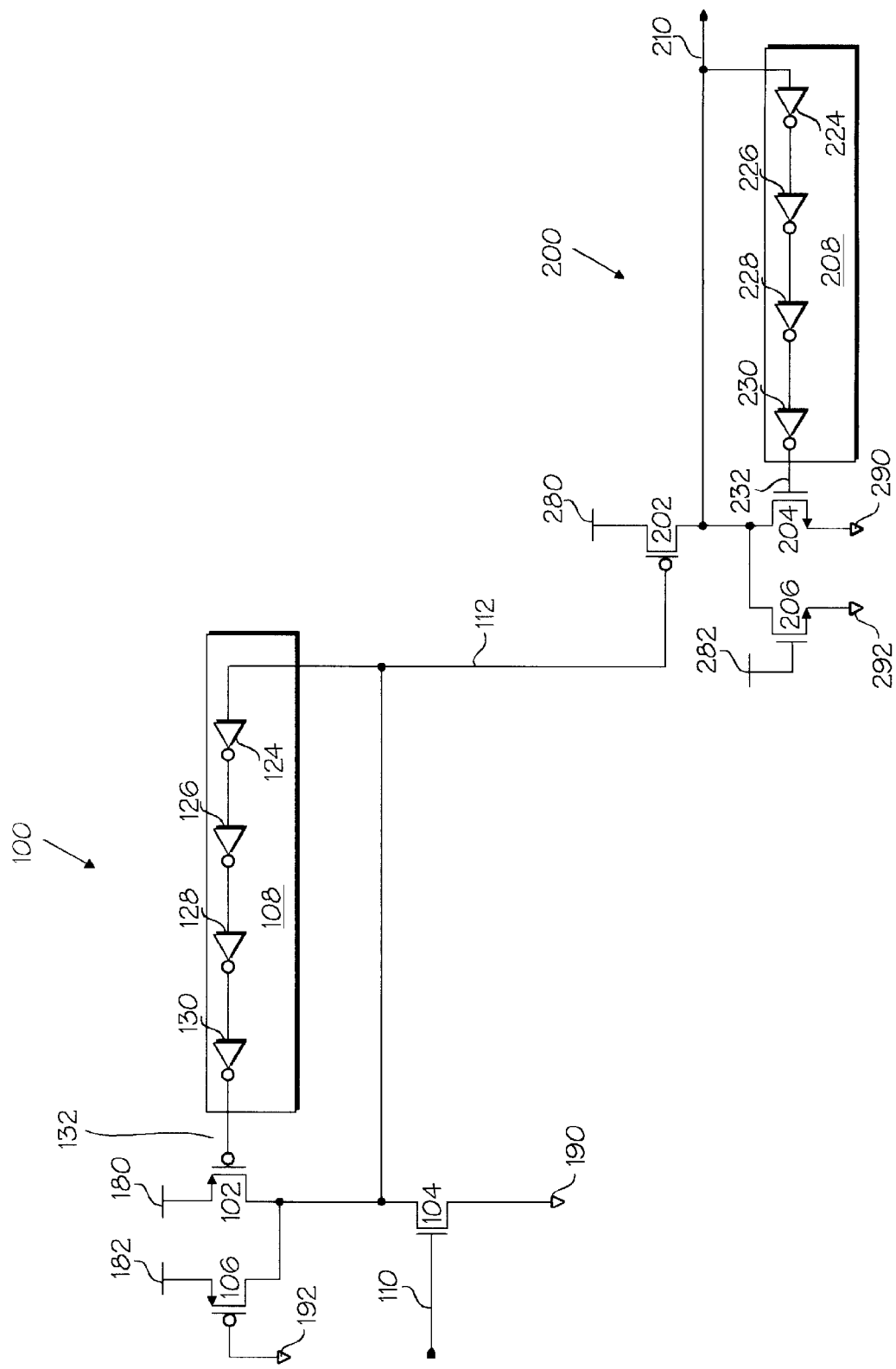
FIG. 2 illustrates, for one embodiment, circuitry for two self-resetting logic stages that function as inverters.

FIG. 2 illustrates, for one embodiment, circuitry for a first self-resetting logic stage 100 that functions as an inverter and a second self-resetting logic stage 200 that functions as an inverter.

Self-resetting logic circuitry may be used for synchronous applications where gate inputs come at predictable intervals, such as those for microprocessors, cache memories, or other digital devices having clocked inputs for example.

Stages 100 and 200 may be configured with other stages in a digital logic path. Stages 100 and 200 may be coupled to other self-resetting logic stages, for example. Stage 100 may be coupled to receive an input pulse signal from a preceding stage in the logic path, and stage 200 may be coupled to output an output pulse signal to a succeeding stage in the logic path.

As illustrated in FIG. 2, stage 100 includes a reset transistor 102, a forward transistor 104, a weak transistor 106, a reset chain 108, an input node 110, an output node 112, and voltage terminals 180, 182, 190, and 192.

The voltage level at voltage terminals 180 and 182 may represent a high or logical-one voltage level and may be approximately 3.3 Volts, for example. The voltage level at voltage terminals 190 and 192 may represent a low or logical-zero voltage level and may be approximately zero (0) Volts, for example. Other suitable voltage levels may also be used for voltage terminals 180, 182, 190, and 192.

Forward transistor 104 may be an NMOS transistor, for example. The drain, gate, and source of forward transistor 104 are coupled to output node 112, input node 110, and voltage terminal 190, respectively. Forward transistor 104 creates a forward path for stage 100. When input node 110 is driven high, forward transistor 104 is turned on and couples output node 112 to voltage terminal 190, pulling output node 112 low.

Reset chain 108 includes inverters 124, 126, 128, and 130. The output terminals of inverters 124, 126, and 128 are coupled to the input terminals of inverters 126, 128, and 130, respectively. The input terminal of reset chain 108 is the input terminal of inverter 124 and is coupled to output node 112. The output terminal of reset chain 108, node 132, is the output terminal of inverter 130. Reset chain 108 provides for a delay in propagating the signal on output node 112 to node 132. Reset chain 108 may include other suitable circuitry for propagating the signal on output node 112 to node 132.

Reset transistor 102 may be a PMOS transistor, for example. The drain, gate, and source of reset transistor 102 are coupled to output node 112, node 132, and voltage terminal 180, respectively. Reset transistor 102 in combination with reset chain 108 creates a feedback or reset path for stage 100. When node 132 is driven low, reset transistor 102 is turned on and couples output node 112 to voltage terminal 180, pulling output node 112 high.

Weak transistor 106 may be a relatively weak PMOS transistor, for example. The drain, gate, and source of weak transistor 106 are coupled to output node 112, voltage terminal 192, and voltage terminal 182, respectively. Weak transistor 106 couples output node 112 to voltage terminal 182, pulling output node 112 high when reset transistor 102 is not pulling output node 112 high and when forward transistor 104 is not pulling output node 112 low.

Stage 200 of FIG. 2 includes a forward transistor 202, a reset transistor 204, a weak transistor 206, a reset chain 208, an output node 210, and voltage terminals 280, 282, 290, and 292. Node 112 is an input node for stage 200.

The voltage level at voltage terminals 280 and 282 may represent a high or logical-one voltage level and may be approximately 3.3 Volts, for example. The voltage level at voltage terminals 290 and 292 may represent a low or logical-zero voltage level and may be approximately zero (0) Volts, for example. Other suitable voltage levels may also be used for voltage terminals 280, 282, 290, and 292.

Forward transistor 202 may be a PMOS transistor, for example. The drain, gate, and source of forward transistor 202 are coupled to output node 210, node 112, and voltage terminal 280, respectively. Forward transistor 202 creates a forward path for stage 200. When node 112 is driven low, forward transistor 202 is turned on and couples output node 210 to voltage terminal 280, pulling output node 210 high.

Reset chain 208 includes inverters 224, 226, 228, and 230. The output terminals of inverters 224, 226, and 228 are coupled to the input terminals of inverters 226, 228, and 230, respectively. The input terminal of reset chain 208 is the input terminal of inverter 224 and is coupled to output node 210. The output terminal of reset chain 208, node 232, is the output terminal of inverter 230. Reset chain 208 provides for a delay in propagating the signal on output node 210 to node 232. Reset chain 208 may include other suitable circuitry for propagating the signal on output node 210 to node 232.

Reset transistor 204 may be an NMOS transistor, for example. The drain, gate, and source of reset transistor 204 are coupled to output node 210, node 232, and voltage terminal 290, respectively. Reset transistor 204 in combination with reset chain 208 creates a feedback or reset path for stage 200. When node 232 is driven high, reset transistor 204 is turned on and couples output node 210 to voltage terminal 290, pulling output node 210 low.

Weak transistor 206 may be a relatively weak NMOS transistor, for example. The drain, gate, and source of weak transistor 206 are coupled to output node 210, voltage terminal 282, and voltage terminal 292, respectively. Weak transistor 206 couples output node 210 to voltage terminal 292, pulling output node 210 low when reset transistor 204 is not pulling output node 210 low and when forward transistor 202 is not pulling output node 210 high.

Figure 3:
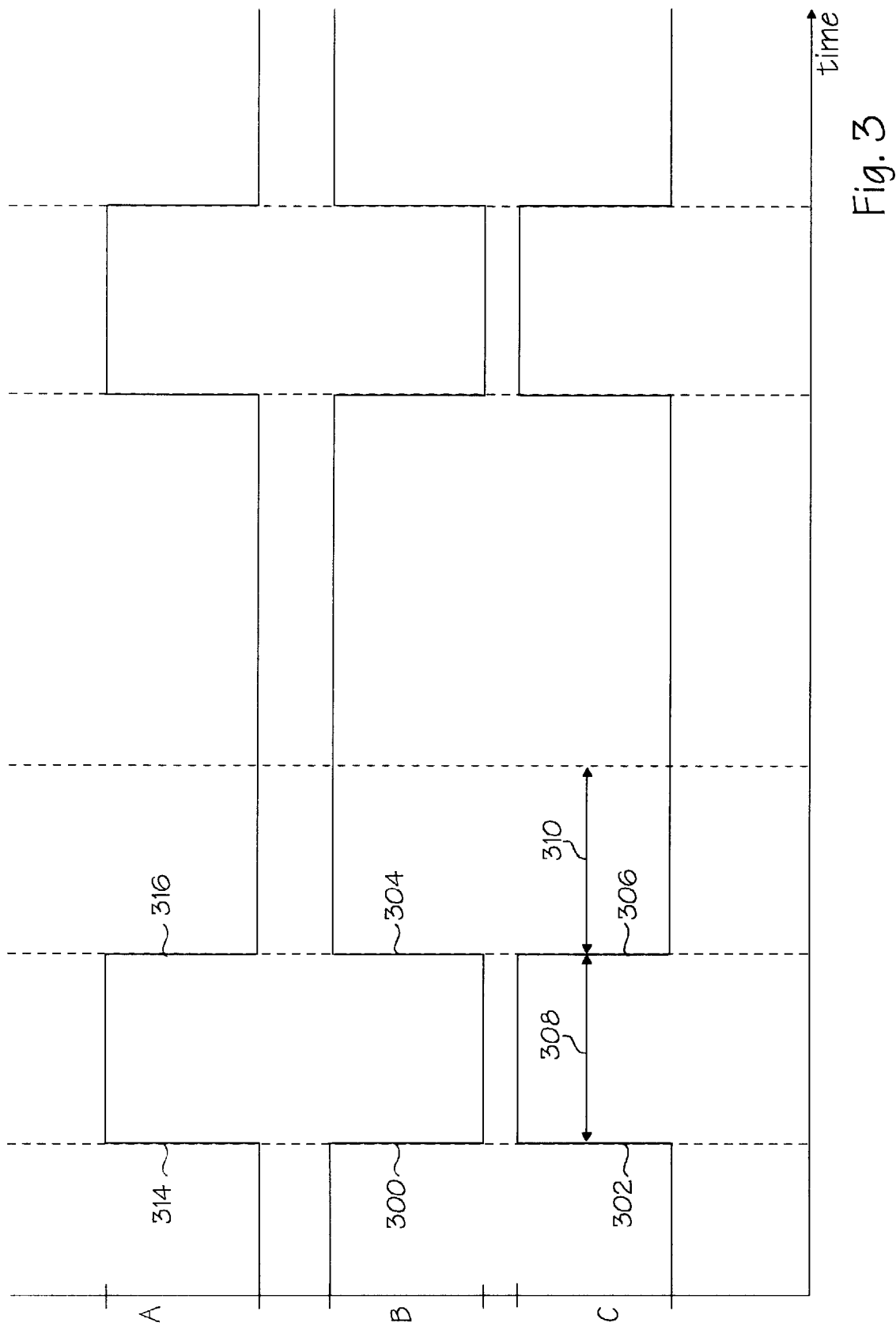
FIG. 3 illustrates a waveform diagram for the circuitry of FIG. 2.

FIG. 3 illustrates a waveform diagram for the circuitry of FIG. 2. Waveforms A, B, and C of FIG. 2 represent signals on input node 110, node 112, and output node 210, respectively.

Stage 100 is in a static state prior to receiving an input pulse signal on input node 110 (waveform A). Forward transistor 104 and reset transistor 102 are both off for this static state. Output node 112 (waveform B) is held high by weak transistor 106.

When stage 100 receives an input pulse signal on input node 110 (waveform A), forward transistor 104 is turned on by a forward or high-going edge 314 of this input pulse signal and pulls output node 112 low, creating on output node 112 (waveform B) a forward edge 300 for an output pulse signal. As reset transistor 102 is off, any flow of overlap current between voltage terminals 180 and 190 is minimized or avoided. Although overlap current may flow between voltage terminals 182 and 190 through weak transistor 106 and forward transistor 104, this current is relatively minimal. For another embodiment, this minimal overlap current may be minimized or avoided by coupling the gate of weak transistor 106 to input node 110.

Reset chain 108 propagates forward or low-going edge 300 to reset transistor 102. Reset transistor 102 is turned on by forward edge 300 and pulls output node 112 high, creating on output node 112 (waveform B) a reset or trailing edge 304 for the output pulse signal. Reset transistor 102 is preferably turned on after forward transistor 104 has been turned off by a trailing or low-going edge 316 of the input pulse signal on input node 110 (waveform A) to minimize or avoid any overlap current from flowing between voltage terminals 180 and 190.

Reset chain 108 subsequently propagates reset or high-going edge 304 to reset transistor 102, turning off reset transistor 102. Weak transistor 106 then continues to hold output node 112 (waveform B) high. After reset transistor 102 has been turned off, stage 100 has recovered from reset and is ready to receive another input pulse signal on input node 110 (waveform A).

Stage 200 is in a static state prior to receiving an input pulse signal on node 112 (waveform B). Forward transistor 202 and reset transistor 204 are both off for this static state as weak transistor 106 holds node 112 (waveform B) high. Output node 210 (waveform C) is held low by weak transistor 206.

When stage 200 receives forward or low-going edge 300 of the pulse signal on node 112 (waveform B) from stage 100, forward transistor 202 is turned on and pulls output node 210 high, creating on output node 210 (waveform C) a forward edge 302 for an output pulse signal. As reset transistor 204 is off, any flow of overlap current between voltage terminals 280 and 290 is minimized or avoided. Although overlap current may flow between voltage terminals 280 and 292 through forward transistor 202 and weak transistor 206, this current is relatively minimal. For another embodiment, this minimal overlap current may be minimized or avoided by coupling the gate of weak transistor 206 to node 112. Forward transistor 202 remains on during time period 308 until forward transistor 202 is turned off by trailing or high-going edge 304 of the pulse signal on node 112 (waveform B).

Reset chain 208 propagates forward or high-going edge 302 to reset transistor 204. Reset transistor 204 is turned on by forward edge 302 and pulls output node 210 low, creating on output node 210 (waveform C) a reset or trailing edge 306 for the output pulse signal. Reset transistor 204 is preferably turned on after forward transistor 202 has been turned off to minimize or avoid any overlap current from flowing between voltage terminals 280 and 290.

During time period 310 reset chain 208 propagates reset or low-going edge 306 to reset transistor 204, turning off reset transistor 204. Weak transistor 206 then continues to hold output node 210 (waveform C) low. After reset transistor 204 has been turned off, stage 200 has recovered from reset and is ready to receive another pulse signal on node 112 (waveform B).

Self-resetting logic stages 100 and 200 of FIG. 2 provide for a relatively faster propagation of signals as compared to typical CMOS stages. For each stage, the forward path propagates the forward edge for the output pulse signal in response to the input pulse signal while the feedback or reset path propagates the trailing edge for the output pulse signal in response to this forward edge. As the forward path is the only path driven by the input for the stage, the load presented by the stage is relatively reduced as compared to typical CMOS stages, providing for a relatively reduced switching time for any preceding stage. Self-resetting logic stages 100 and 200 also minimize or avoid any overlap current in propagating the forward edge for the output pulse signal onto the output node for the stage, providing for relatively reduced switching time for each stage.

In propagating the reset or trailing edge for the output pulse signal onto the output node for each stage 100 and 200 of FIG. 2, the forward transistor is preferably turned off before the reset transistor is turned on. Overlap current otherwise results and consumes current and power from the stage. With less current available, the reset transistor may be delayed in propagating the reset or trailing edge for the output pulse signal. As any delay in propagating the trailing edge for the output pulse signal may delay turning off the forward transistor for a succeeding stage, overlap current may result for succeeding stages and may lead to degraded circuit performance or loss of functionality.

To minimize or avoid this overlap current, the reset chain for each successive stage in a logic path may be provided with an increased propagation delay, helping to ensure the reset transistor for a stage is not turned on before the forward transistor for the stage has been turned off. Any suitable circuitry may be used for each reset chain to provide for this increased propagation delay.

Figure 4:
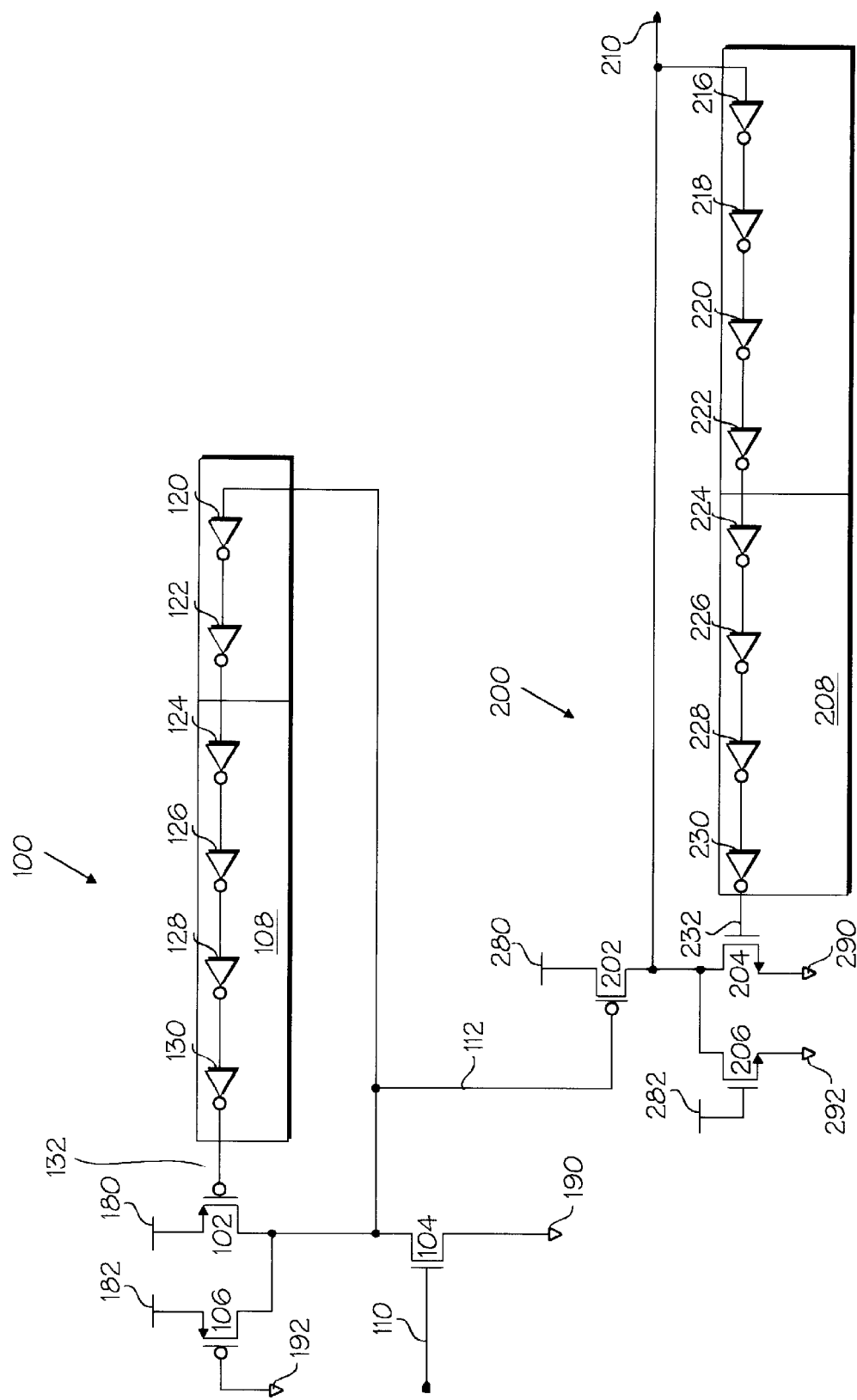
FIG. 4 illustrates, for another embodiment, circuitry for the two self-resetting logic stages of FIG. 2 having reset chains with a fan-up chain and a pad delay chain.

FIG. 4 illustrates, for one embodiment, circuitry for self-resetting logic stages 100 and 200 of FIG. 2 having reset chains 108 and 208 with a fan-up chain and a pad delay chain.

As illustrated in FIG. 4, reset chain 108 includes a pad delay chain having inverters 120 and 122 and a fan-up chain having inverters 124, 126, 128, and 130. The output terminals of inverters 120, 122, 124, 126, and 128 are coupled to the input terminals of inverters 122, 124, 126, 128, and 130, respectively. The input terminal of reset chain 108 is the input terminal of inverter 120 and is coupled to output node 112. The output terminal of reset chain 108, node 132, is the output terminal of inverter 130. Reset chain 108 of FIG. 4 provides for a fan-up and pad delay in propagating the signal on output node 112 to node 132.

Reset chain 208 of FIG. 4 includes a pad delay chain having inverters 216, 218, 220, and 222 and a fan-up chain having inverters 224, 226, 228, and 230. The output terminals of inverters 216, 218, 220, 222, 224, 226, and 228 are coupled to the input terminals of inverters 218, 220, 222, 224, 226, 228, and 230, respectively. The input terminal of reset chain 208 is the input terminal of inverter 216 and is coupled to output node 210. The output terminal of reset chain 208, node 232, is the output terminal of inverter 230. Reset chain 208 of FIG. 4 provides for a fan-up and pad delay in propagating the signal on output node 210 to node 232.

For the self-resetting logic circuitry of FIG. 4, the fan-up chain for reset chains 108 and 208 each include four fan-up inverters. Each fan-up inverter may have approximately the same fanout, that is the ratio of load size to driver size. For one embodiment, the fanout for each fan-up inverter may be approximately three, for example.

Figure 6:
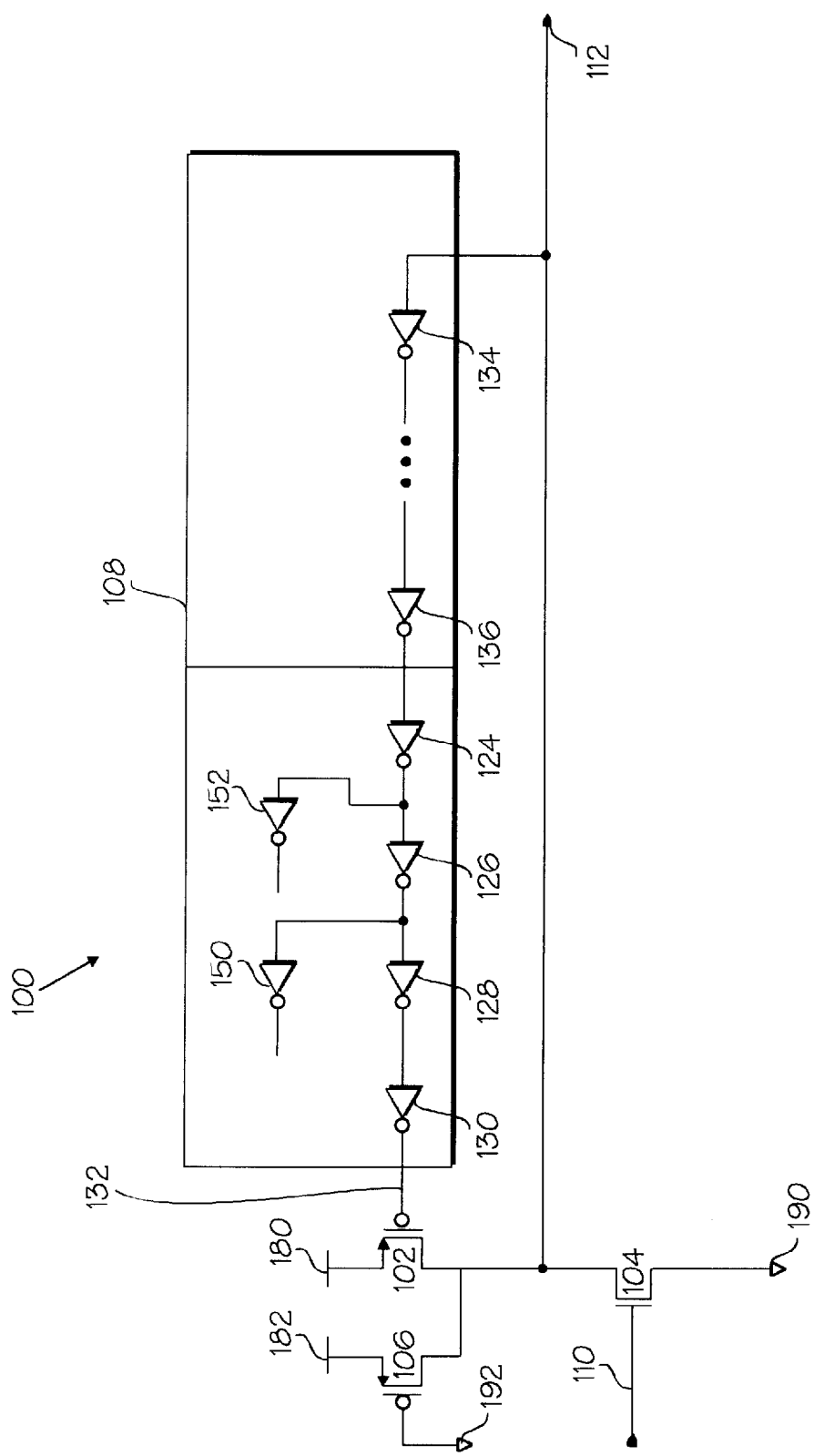
FIG. 6 illustrates, for one embodiment, circuitry for a self-resetting logic stage having a reset chain with a dummy load.
Figure 7:
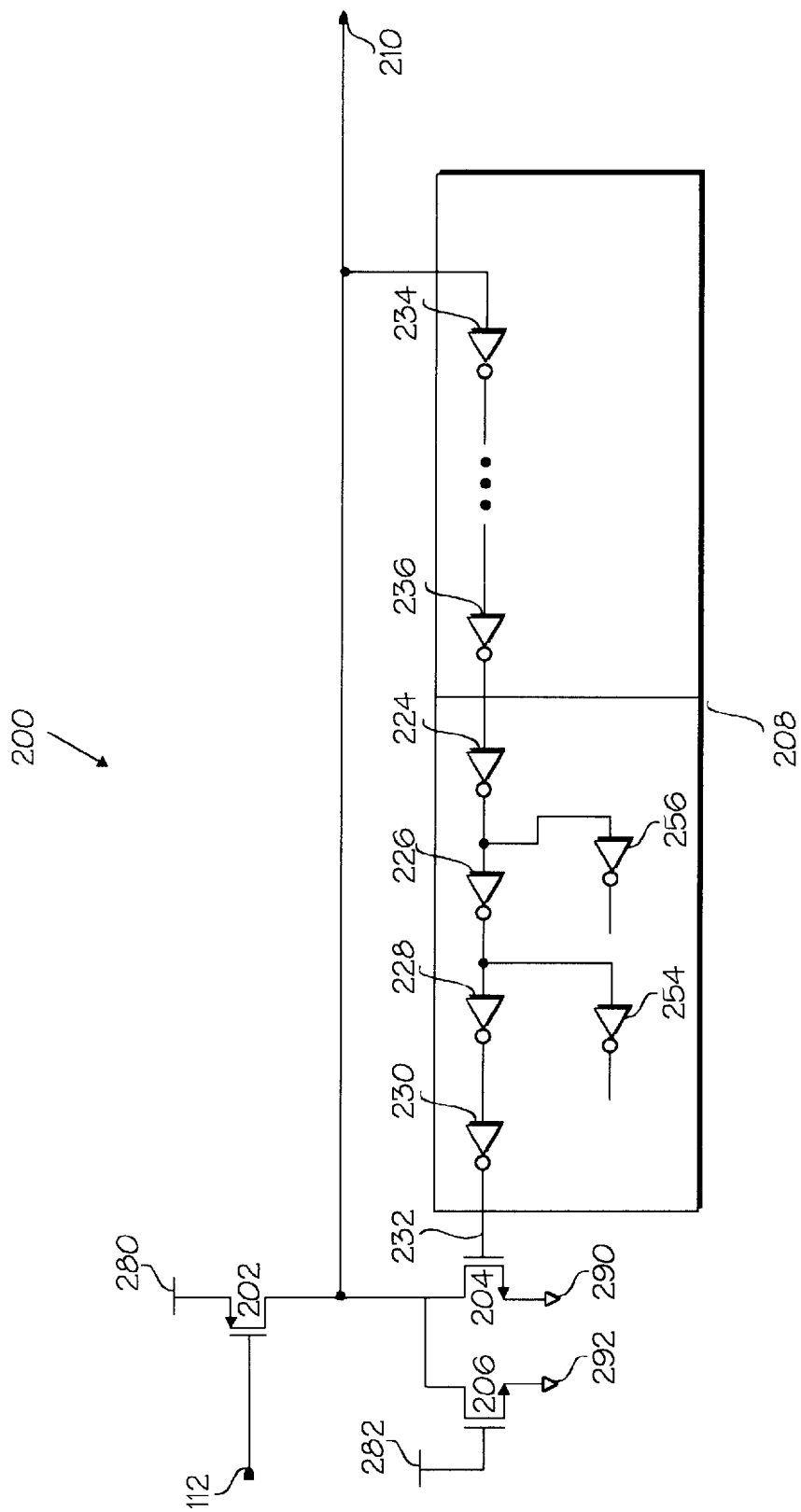
FIG. 7 illustrates, for another embodiment, circuitry for a self-resetting logic stage having a reset chain with a dummy load.
Figure 8:
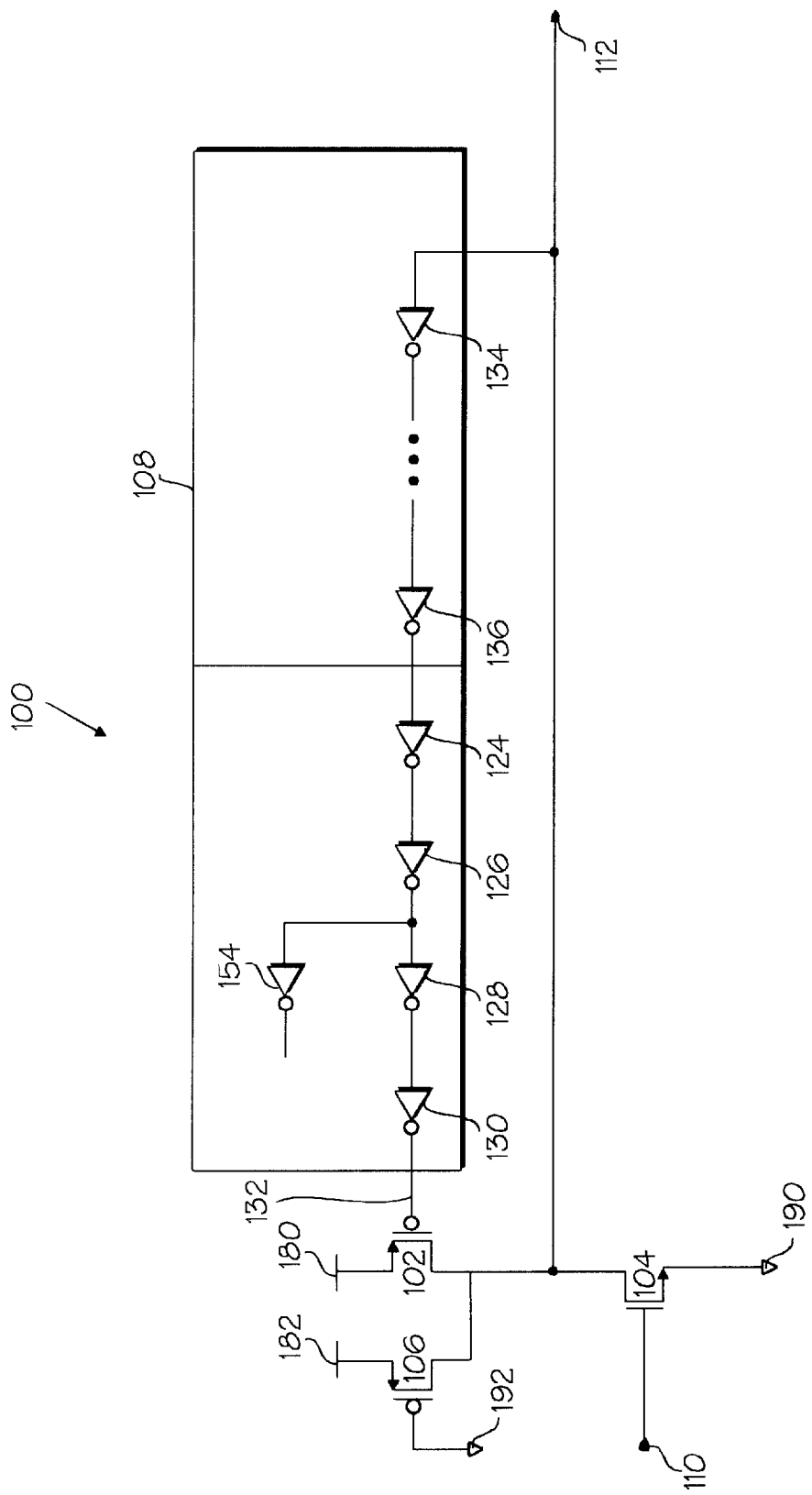
FIG. 8 illustrates, for another embodiment, circuitry for a self-resetting logic stage having a reset chain with a dummy load.

The fan-up chain for each stage may have approximately the same propagation delay regardless of the size of the reset transistor for the stage. As the reset transistor size may be varied depending, for example, on the size of the load the stage is to drive, the size of the fan-up inverters for the stage may be differed to maintain the approximately same fanout. Dummy loads may also be used for each fan-up chain, for example to maintain the fanout without violating minimum transistor size requirements of the technology. Any suitable circuitry may be used to provide for dummy loads. FIGS. 6, 7, and 8, discussed below, illustrate exemplary self-resetting logic stages 100 and 200 having reset chains 108 and 208 with dummy loads.

For other embodiments, the fan-up chain for reset chains 108 and 208 may include other suitable circuitry. The fan-up chain for reset chains 108 and 208 may include some other number of inverters, for example.

The pad delay chain for reset chains 108 and 208 of FIG. 4 serve to provide for an increased propagation delay for reset chain 208 as compared to reset chain 108. As illustrated in FIG. 4, the pad delay chain for reset chain 208 has four pad inverters while the pad delay chain for reset chain 108 has two pad inverters. As the propagation delay for a reset chain determines the width of the output pulse signal for a given stage, the pulse signal output by stage 200 is greater in width than the pulse signal output by stage 100. For other embodiments, the pad delay chain for reset chains 108 and 208 may include other suitable circuitry.

Figure 5:
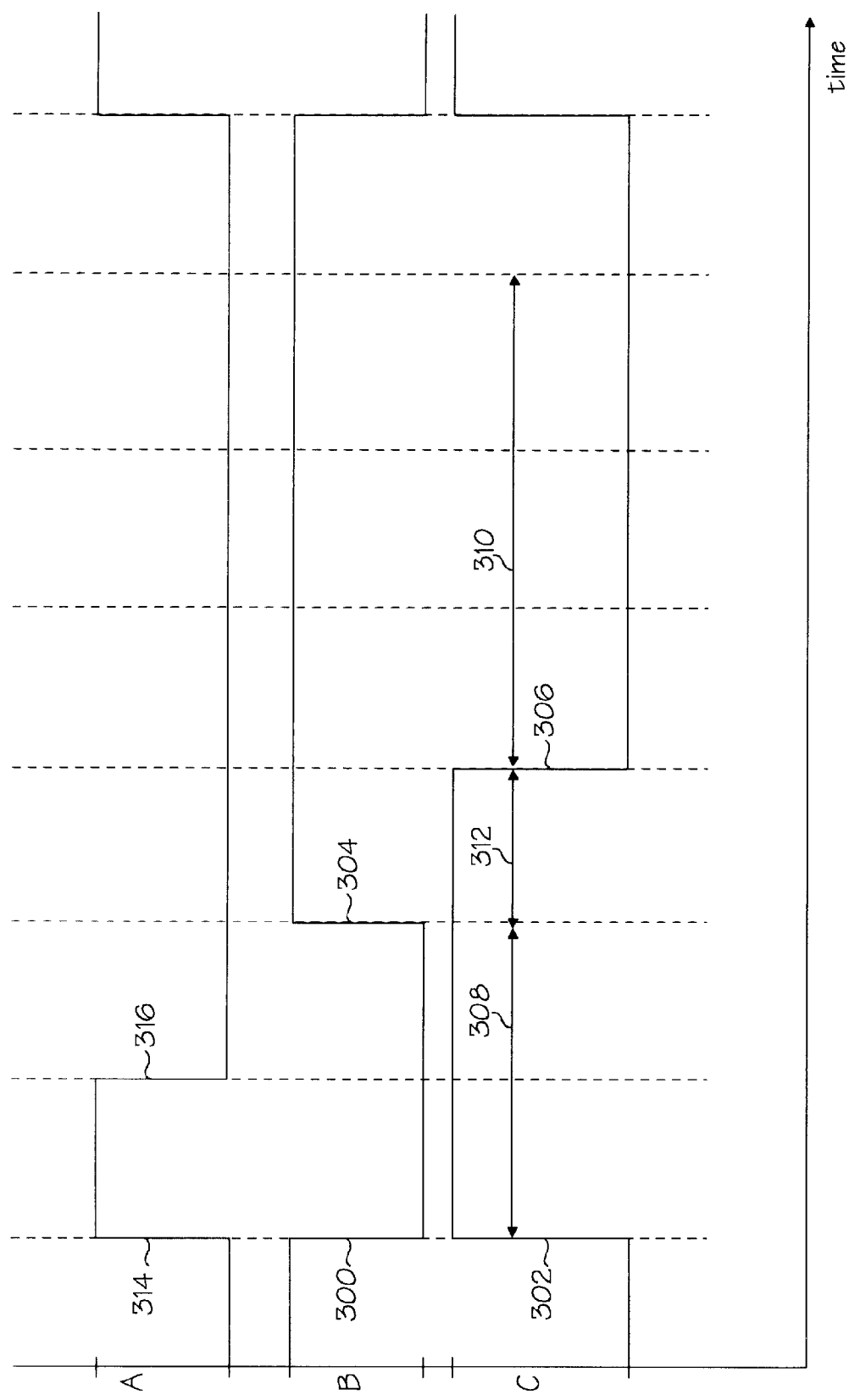
FIG. 5 illustrates a waveform diagram for the circuitry of FIG. 4.

FIG. 5 illustrates a waveform diagram for the circuitry of FIG. 4. Waveforms A, B, and C of FIG. 5 represent signals on input node 110, node 112, and output node 210, respectively. Waveforms A, B, and C of FIG. 5 correspond to waveforms A, B, and C as illustrated in FIG. 3. As illustrated in FIG. 5, the pulse signal on output node 210 (waveform C) is greater in width than the pulse signal on output node 112 (waveform B).

During time period 308, forward transistor 202 remains on until trailing or reset edge 304 of the pulse signal on node 112 (waveform B) turns forward transistor 202 off. As reset chain 208 includes two additional pad inverters as compared to reset chain 108, reset transistor 204 is not turned on until after both time period 308 and time period 312. That is, reset transistor 204 is not turned on until after forward edge 302 of the output pulse signal on output node 210 (waveform C) has propagated through reset chain 208. Time period 312 represents the additional propagation delay for reset chain 208 as compared to that for reset chain 108.

The increased propagation delay for reset chain 208 thus helps to ensure that forward transistor 202 and reset transistor 204 are not on simultaneously. As such, overlap current between voltage terminals 280 and 290 is minimized or avoided.

Stages 100 and 200 of FIG. 4 may be configured with other stages in a digital logic path. Stages 100 and 200 may be coupled to other self-resetting logic stages, for example. To maintain an increased propagation delay for each successive stage in the logic path, the stage driven by stage 200 may have six pad inverters for its reset chain. The stage driving stage 100 may not have any pad inverters for its reset chain and is preferably the first stage in the logic path. For other embodiments, the number of pad inverters for each successive stage in a logic path may be incremented by some number other than two.

Each pad inverter may have approximately the same fanout, that is the ratio of load size to driver size. For one embodiment, the fanout for each pad inverter may be approximately one, for example, so that the delay for each pad inverter is relatively small, providing for a relatively small increase in the width of a pulse signal as the pulse signal propagates along the logic path. The increased number of pad inverters for the reset chain for each successive stage helps to ensure overlap current is minimized or avoided despite any minimal delay variations of each reset chain due to such factors as the proximity of each inverter gate to any previous inverter gate, any differences in the power supply voltage for each inverter gate, and any noise in the power supply.

FIG. 6 illustrates circuitry for a self-resetting logic stage 100 having reset chain 108 with a dummy load. For reset chain 108 of FIG. 6, the fan-up chain includes inverters 124, 126, 128, 130, 150, and 152. Inverters 150 and 152 provide for a dummy load for reset chain 108. The pad delay chain for reset chain 108 includes a variable number of inverters, including first inverter 134 and last inverter 136. The number of pad inverters may depend, for example, on the position of stage 100 among other stages in a digital logic path.

The pad inverters for the pad delay chain are coupled in series similarly as described above for reset chain 108 of FIG. 4. Fan-up inverters 124, 126, 128, and 130 are also coupled in series as described above for reset chain 108 of FIG. 4. The input terminal of inverters 150 and 152 are coupled to the output terminal of inverters 126 and 124, respectively. Inverters 150 and 152 do not drive any load on their output terminals.

Even for different sized loads that are to be driven by the stage, each inverter in the pad delay chain may be approximately the same size while the first inverter in the fan-up chain may also be approximately this same size. The pad inverters are preferably of minimum size, for example so as to minimize layout area for stage 100 despite the number of pad inverters used and to minimize the load presented by reset chain 108 to the output of stage 100. The minimum size may depend, for example, on the technology and its design rules.

For an approximately 0.5 $\mu$m channel length technology, each pad inverter may include an approximately 4.4 $\mu$m wide PMOS transistor, for example, and an approximately 2.2 $\mu$m wide NMOS transistor, for example.

The inverters for the fan-up chain are also preferably of minimum size allowed for the technology. The size of these inverters may depend, for example, on the capacitance of the load to be driven.

For one embodiment where an approximately 0.5 $\mu$m channel length technology is used and where a load with a capacitance of approximately 1 pF, for example, is driven, inverters 124 and 126 may each include an approximately 4.4 $\mu$m wide PMOS transistor and an approximately 2.2 $\mu$m wide NMOS transistor. Inverters 128, 130, 150 and 152 may include an approximately 7.0 $\mu$m, 21.2 $\mu$m, 6.2 $\mu$m and 8.8 $\mu$m wide PMOS transistor, respectively, and may also include an approximately 3.5 $\mu$m, 10.6 $\mu$m, 3.1 $\mu$m, and 4.4 $\mu$m wide NMOS transistor, respectively. Forward transistor 104 may be an approximately 48 $\mu$m wide NMOS transistor, reset transistor 102 may be an approximately 96 $\mu$m wide PMOS transistor, and weak transistor 106 may be an approximately 1.9 $\mu$m wide PMOS transistor.

FIG. 7 illustrates circuitry for a self-resetting logic stage 200 having reset chain 208 with a dummy load. For reset chain 208 of FIG. 7, the fan-up chain includes inverters 224, 226, 228, 230, 254, and 256. Inverters 254 and 256 provide for a dummy load for reset chain 208. The pad delay chain for reset chain 208 includes a variable number of inverters, including first inverter 234 and last inverter 236. The number of pad inverters may depend, for example, on the position of stage 200 among other stages in a digital logic path.

The pad inverters for the pad delay chain are coupled in series similarly as described above for reset chain 208 of FIG. 4. Fan-up inverters 224, 226, 228, and 230 are also coupled in series as described above for reset chain 208 of FIG. 4. The input terminal of inverters 254 and 256 are coupled to the output terminal of inverters 226 and 224, respectively. Inverters 254 and 256 do not drive any load on their output terminals.

For self-resetting logic stage 200 of FIG. 7, the above discussion regarding pad inverters and fan-up inverters for reset chain 108 of FIG. 6 not inconsistent with the following discussion also applies.

For one embodiment where an approximately 0.5 $\mu$m channel length technology is used and where a load with a capacitance of approximately 3 pF, for example, is driven, inverters 224 and 254 may each include an approximately 4.4 $\mu$m wide PMOS transistor and an approximately 2.2 $\mu$m wide NMOS transistor. Inverters 226, 228, 230 and 256 may include an approximately 5 $\mu$m, 10.6 $\mu$m, 32 $\mu$m, and 8.2 $\mu$m wide PMOS transistor, respectively, and may also include an approximately 2.5 $\mu$m, 5.3 $\mu$m, 16 $\mu$m, and 4.1 $\mu$m wide NMOS transistor, respectively. Forward transistor 202 may be an approximately 288 $\mu$m wide PMOS transistor, reset transistor 204 may be an approximately 144 $\mu$m wide NMOS transistor, and weak transistor 206 may be an approximately 2.9 $\mu$m wide NMOS transistor.

FIG. 8 illustrates, for another embodiment, circuitry for a self-resetting logic stage 100 having reset chain 108 with a dummy load. For self-resetting logic stage 100 of FIG. 8, the above discussion regarding pad inverters and fan-up inverters for reset chain 108 of FIG. 6 not inconsistent with the following discussion applies.

For reset chain 108 of FIG. 8, only one inverter 154 provides for a dummy load. The input terminal of inverter 154 is coupled to the output terminal of inverter 126. Inverter 154 does not drive any load on its output terminal.

For one embodiment where an approximately 0.5 $\mu$m channel length technology is used and where a load with a capacitance of approximately 5 pF, for example, is driven, inverters 124 and 154 may each include an approximately 4.4 $\mu$m wide PMOS transistor and an approximately 2.2 $\mu$m wide NMOS transistor. Inverters 126, 128, and 130 may include an approximately 13.2 $\mu$m, 35.2 $\mu$m, and 106 $\mu$m wide PMOS transistor, respectively, and may also include an approximately 6.6 $\mu$m, 17.6 $\mu$m, and 53 $\mu$m wide NMOS transistor, respectively. Forward transistor 104 may be an approximately 240 $\mu$m wide NMOS transistor, reset transistor 102 may be an approximately 480 $\mu$m wide PMOS transistor, and weak transistor 106 may be an approximately 9.6 $\mu$m wide PMOS transistor.

The reset chains illustrated in FIGS. 6, 7, and 8 are exemplary for reset chains with a dummy load. Other suitable transistor widths may also be used to provide for the circuitry illustrated in FIGS. 6, 7, and 8 and may depend, for example, on the capacitance of the load to be driven.

Figure 9:
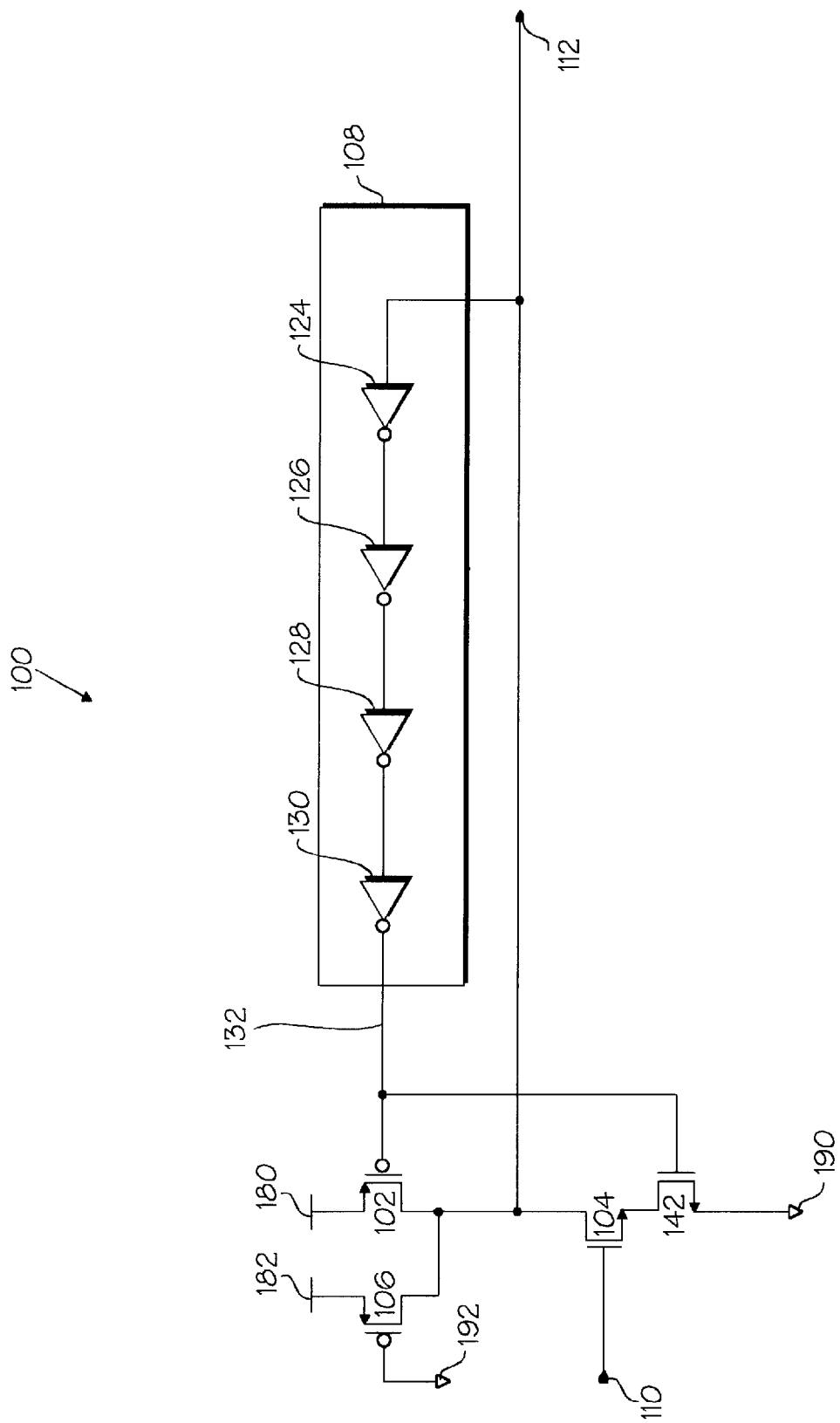
FIG. 9 illustrates, for one embodiment, circuitry for a self-resetting logic stage configured as a pulse width shrinker.
Figure 10:
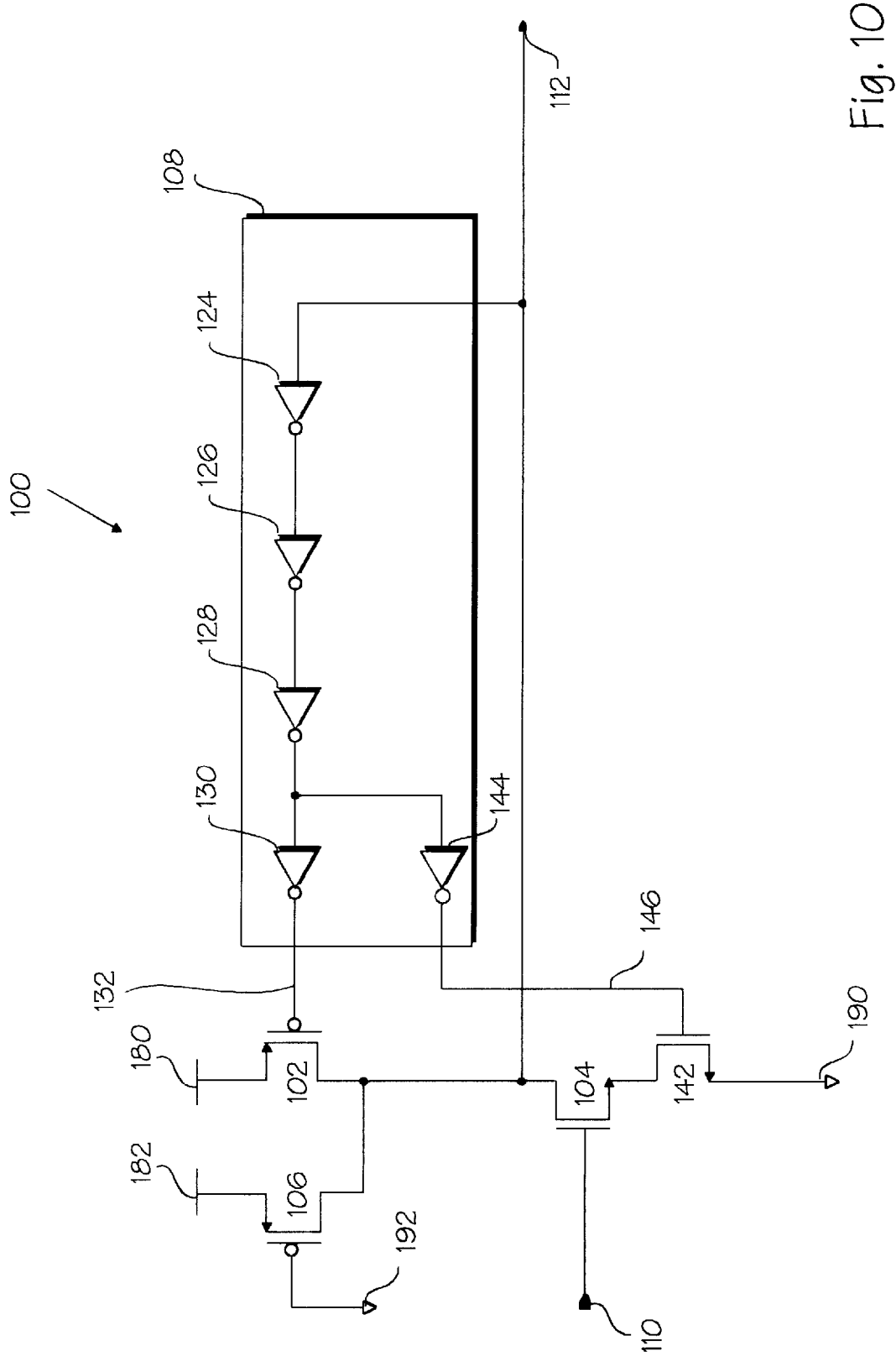
FIG. 10 illustrates, for another embodiment, circuitry for a self-resetting logic stage configured as a pulse width shrinker.

FIG. 9 illustrates, for one embodiment, circuitry for a self-resetting logic stage 100 configured as a pulse shrinker (PS) stage. FIG. 10 illustrates, for another embodiment, circuitry for a self-resetting logic stage 100 configured as a pulse shrinker (PS) stage.

Pulse shrinker (PS) stage 100 of FIGS. 9 and 10 may be configured with a plurality of self-resetting logic stages, such as those illustrated in FIG. 4 for example, in a digital logic path. As the self-resetting logic stages of FIG. 4 increase the width of the pulse signal as the pulse signal propagates from stage to stage, the cycle time for the logic path increases and may degrade the performance of the logic path. The cycle time for a logic path may be dictated, for example, by the speed with which a clocked stage, such as a self-resetting logic stage for example, can respond to a pulse edge and recover from this response in order to receive a new pulse edge.

For a logic path having self-resetting logic stages such as those illustrated in FIG. 4, the cycle time for the logic path is limited by the longest propagation delay for a reset chain within the logic path. As a self-resetting logic stage reacts to a new input pulse signal after the output of the stage has been reset and after its reset transistor has been turned off, the self-resetting logic stage having the reset chain with the longest propagation delay limits the cycle time by the sum of the delay for its forward transistor to create the forward edge for an output pulse signal, the delay for its reset chain to propagate this forward edge, the delay for its reset transistor to create the reset edge for the output pulse signal, and the delay for its reset chain to propagate this reset edge.

To minimize any increase in cycle time for a logic path having self-resetting logic stages such as those illustrated in FIG. 4 for example, a pulse shrinker stage, such as PS stage 100 of FIGS. 9 and 10 for example, may be positioned within the logic path to reduce the width of the pulse signal as the pulse signal propagates along the logic path.

For pulse shrinker (PS) stage 100 of FIG. 9, the circuit elements of stage 100 function in substantially the same manner as and are similarly configured as their corresponding elements for stage 100 of FIG. 2. Stage 100 of FIG. 9 further includes gating transistor 142.

Gating transistor 142 may be an NMOS transistor, for example. Gating transistor 142 is coupled in series between forward transistor 104 and voltage terminal 190. The drain, gate, and source of gating transistor 142 are coupled to the source of forward transistor 104, node 132, and voltage terminal 190, respectively. Gating transistor 142 couples the source of forward transistor 104 to voltage terminal 190 when node 132 is driven high.

Figure 11:
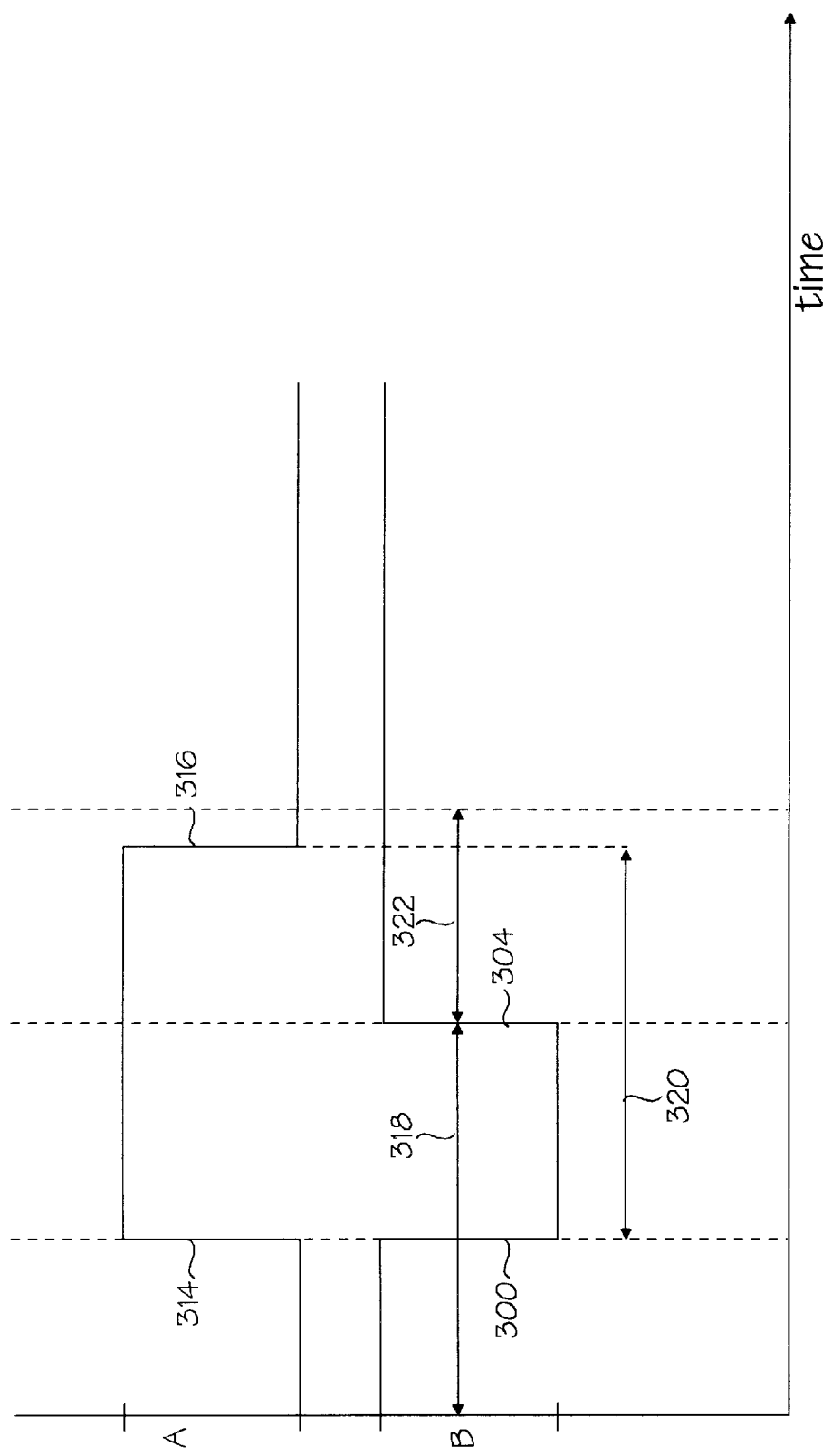
FIG. 11 illustrates a waveform diagram for the circuitry of FIGS. 9 and 10.

FIG. 11 illustrates a waveform diagram for the circuitry of FIG. 9. Waveforms A and B represent signals on input node 110 and output node 112, respectively.

Stage 100 of FIG. 9 is in a static state prior to receiving an input pulse signal on input node 110 (waveform A). Forward transistor 104 and reset transistor 102 are both off for this static state. Output node 112 (waveform B) is held high by weak transistor 106. Gating transistor 142 is on as node 132 is held high by reset chain 108.

When stage 100 receives an input pulse signal on input node 110 (waveform A), forward transistor 104 is turned on by a forward or high-going edge 314 of this input pulse signal. Because gating transistor 142 is already on, output node 112 is pulled low, creating on output node 112 (waveform B) forward edge 300 for an output pulse signal. Forward transistor 104 remains on during time period 320 until a trailing edge 316 of the input pulse signal on input node 110 (waveform A) turns off forward transistor 104. Gating transistor 142 remains on during time period 318 until reset chain 108 propagates forward edge 300 to gating transistor 142, turning off gating transistor 142. Reset transistor 102 remains off during time period 318.

Reset chain 108 propagates forward or low-going edge 300 to reset transistor 102. Reset transistor 102 is turned on by forward edge 300 and pulls output node 112 high, creating on output node 112 (waveform B) a reset or trailing edge 304 for the output pulse signal. Reset chain 108 also propagates forward edge 300 to gating transistor 142, turning off gating transistor 142. Although forward transistor 104 is turned on while gating transistor 142 and reset transistor 102 are transitioning between on and off states, any overlap current between voltage terminals 180 and 190 is similar to that for typical CMOS logic stages.

Reset transistor 102 remains on during time period 322 until reset chain 108 propagates reset or high-going edge 304 to reset transistor 102, turning off reset transistor 102. Gating transistor 142 remains off during time period 322 until reset chain 108 propagates reset edge 304 to gating transistor 142, turning on gating transistor 142. Weak transistor 106 then continues to hold output node 112 (waveform B) high.

For pulse shrinker (PS) stage 100 of FIG. 10, the circuit elements of stage 100 function in substantially the same manner as and are similarly configured as their corresponding elements for stage 100 of FIG. 2. Stage 100 of FIG. 10 further includes inverter 144 for reset chain 108 and gating transistor 142.

For reset chain 108 of FIG. 10, the output terminal of inverter 128 is additionally coupled to the input terminal of inverter 144. Node 146 is the output terminal of inverter 144. Reset chain 108 provides for a delay in propagating the signal on output node 112 to node 132. Reset chain 108 also provides for a delay in propagating the signal on output node 112 to node 146. Reset chain 108 may include other suitable circuitry for propagating the signal on output node 112 to nodes 132 and 146.

Gating transistor 142 may be an NMOS transistor, for example. Gating transistor 142 is coupled in series between forward transistor 104 and voltage terminal 190. The drain, gate, and source of gating transistor 142 are coupled to the source of forward transistor 104, node 146, and voltage terminal 190, respectively. Gating transistor 142 couples the source of forward transistor 104 to voltage terminal 190 when node 146 is driven high.

FIG. 11 illustrates a waveform diagram for the circuitry of FIG. 10 also. Waveforms A and B represent signals on input node 110 and output node 112, respectively.

Stage 100 of FIG. 10 is in a static state prior to receiving an input pulse signal on input node 110 (waveform A). Forward transistor 104 and reset transistor 102 are both off for this static state. Output node 112 (waveform B) is held high by weak transistor 106. Gating transistor 142 is on as node 146 is held high by reset chain 108.

When stage 100 receives an input pulse signal on input node 110 (waveform A), forward transistor 104 is turned on by a forward or high-going edge 314 of this input pulse signal. Because gating transistor 142 is already on, output node 112 is pulled low, creating on output node 112 (waveform B) forward edge 300 for an output pulse signal. Forward transistor 104 remains on during time period 320 until a trailing edge 316 of the input pulse signal on input node 110 (waveform A) turns off forward transistor 104. Gating transistor 142 remains on during time period 318 until reset chain 108 propagates forward edge 300 to gating transistor 142, turning off gating transistor 142. Reset transistor 102 remains off during time period 318.

Reset chain 108 propagates forward or low-going edge 300 to reset transistor 102. Reset transistor 102 is turned on by forward edge 300 and pulls output node 112 high, creating on output node 112 (waveform B) a reset or trailing edge 304 for the output pulse signal. Reset chain 108 also propagates forward edge 300 to gating transistor 142, turning off gating transistor 142. As forward transistor 104 is turned on while gating transistor 142 and reset transistor 102 are transitioning between on and off states, the propagation delay for inverter 144 is preferably less than that for inverter 130 so that gating transistor 142 starts turning off before reset transistor 102 starts turning on. Overlap current between voltage terminals 180 and 190 may thus be minimized or avoided.

Reset transistor 102 remains on during time period 322 until reset chain 108 propagates reset or high-going edge 304 to reset transistor 102, turning off reset transistor 102. Gating transistor 142 remains off during time period 322 until reset chain 108 propagates reset edge 304 to gating transistor 142, turning on gating transistor 142. Weak transistor 106 then continues to hold output node 112 (waveform B) high.

For pulse shrinker (PS) stage 100 of FIGS. 9 and 10, the width of the output pulse signal is a function of the propagation delay for reset chain 108 and is not dependent on the width of the input pulse signal. The width of the input pulse signal, however, is preferably no greater than approximately twice the propagation delay for reset chain 108 as forward transistor 104 is preferably turned off by the trailing edge of the input pulse signal on input node 110 before reset transistor 102 is turned off and gating transistor 142 is turned on. Otherwise, a second output pulse signal may be generated.

Because pulse shrinker (PS) stage 100 of FIGS. 9 and 10 drives the forward edge of the output pulse signal through an additional gating transistor 142, PS stage 100 may have a higher propagation delay as compared to that for stage 100 of FIG. 2. Furthermore, the amount of power consumed by PS stage 100 may also be relatively higher as reset chain 108 drives the load of reset transistor 102 as well as that for the additional gating transistor 142. To minimize these effects PS stage 100 may be used relatively infrequently in a logic path, such as when the propagating pulse signal approaches a width that may limit the cycle time for the logic path.

A self-resetting logic stage, such as stage 100 of FIG. 2, may be configured with other suitable circuitry to provide for the reduction in width for a pulse signal to minimize any increase in cycle time for a logic path. For other embodiments, a pulse shrinker (PS) stage, such as PS stage 100 of FIGS. 9 and 10, may be used to reduce the width of a pulse signal for other suitable purposes.

Other self-resetting logic stages, such as stage 200 of FIG. 2, may also be configured with suitable circuitry to provide for the reduction in width for a pulse signal propagating along a logic path. For example, self-resetting logic stage 200 of FIG. 2 may be configured with suitable circuitry similar to that for pulse shrinker (PS) stage 100 of FIGS. 9 and 10. For stage 200 of FIG. 2, a suitable gating transistor may be coupled between voltage terminal 280 and the source of forward transistor 202. This gating transistor may be a PMOS transistor. Similar to stage 100 of FIG. 9, the gate of this gating transistor may be coupled to the output terminal of reset chain 208, or node 232. Similar to stage 100 of FIG. 10, reset chain 208 may include an additional inverter having an input terminal coupled to the output terminal of inverter 228 and having an output terminal coupled to the gate of the gating transistor.

Figure 12:
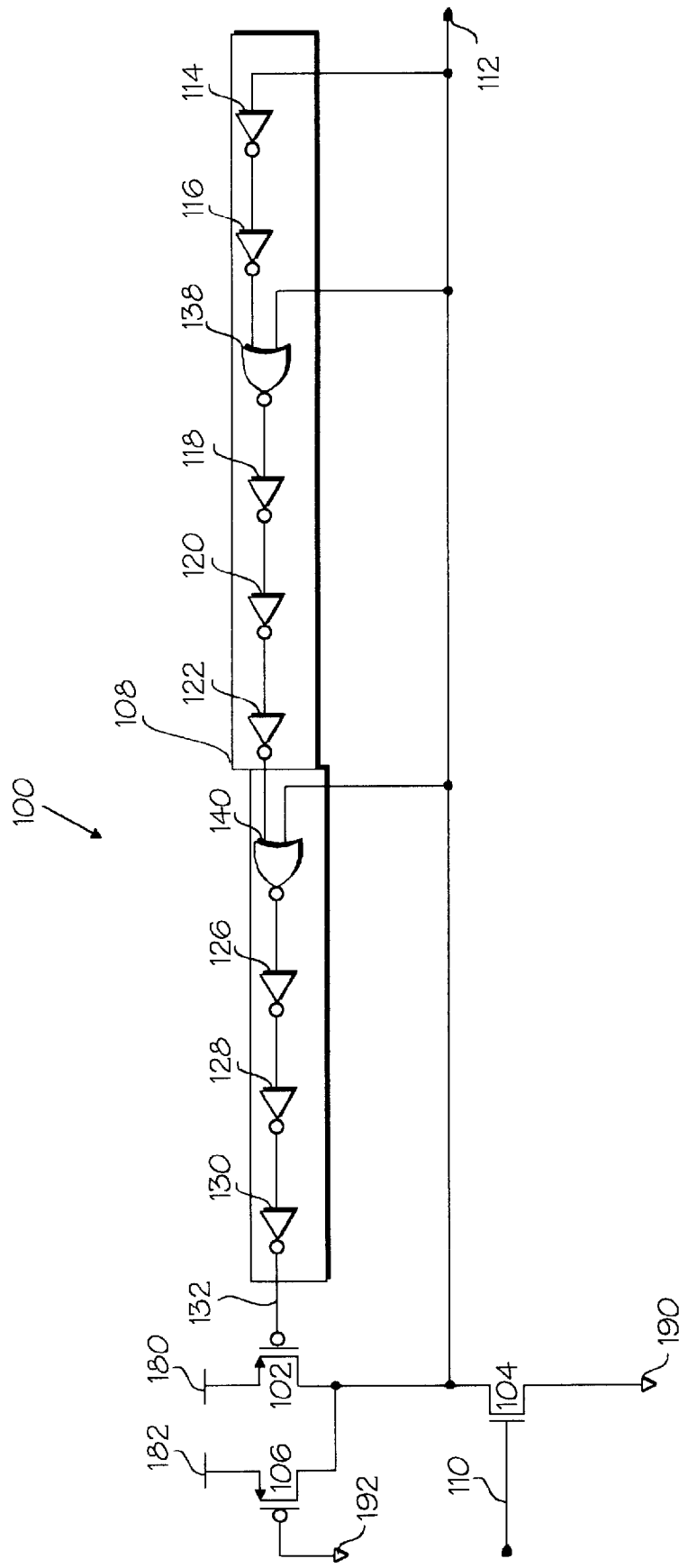
FIG. 12 illustrates, for one embodiment, circuitry for a quick reset recovery (QRR) self-resetting logic stage having a QRR reset chain.
Figure 13:
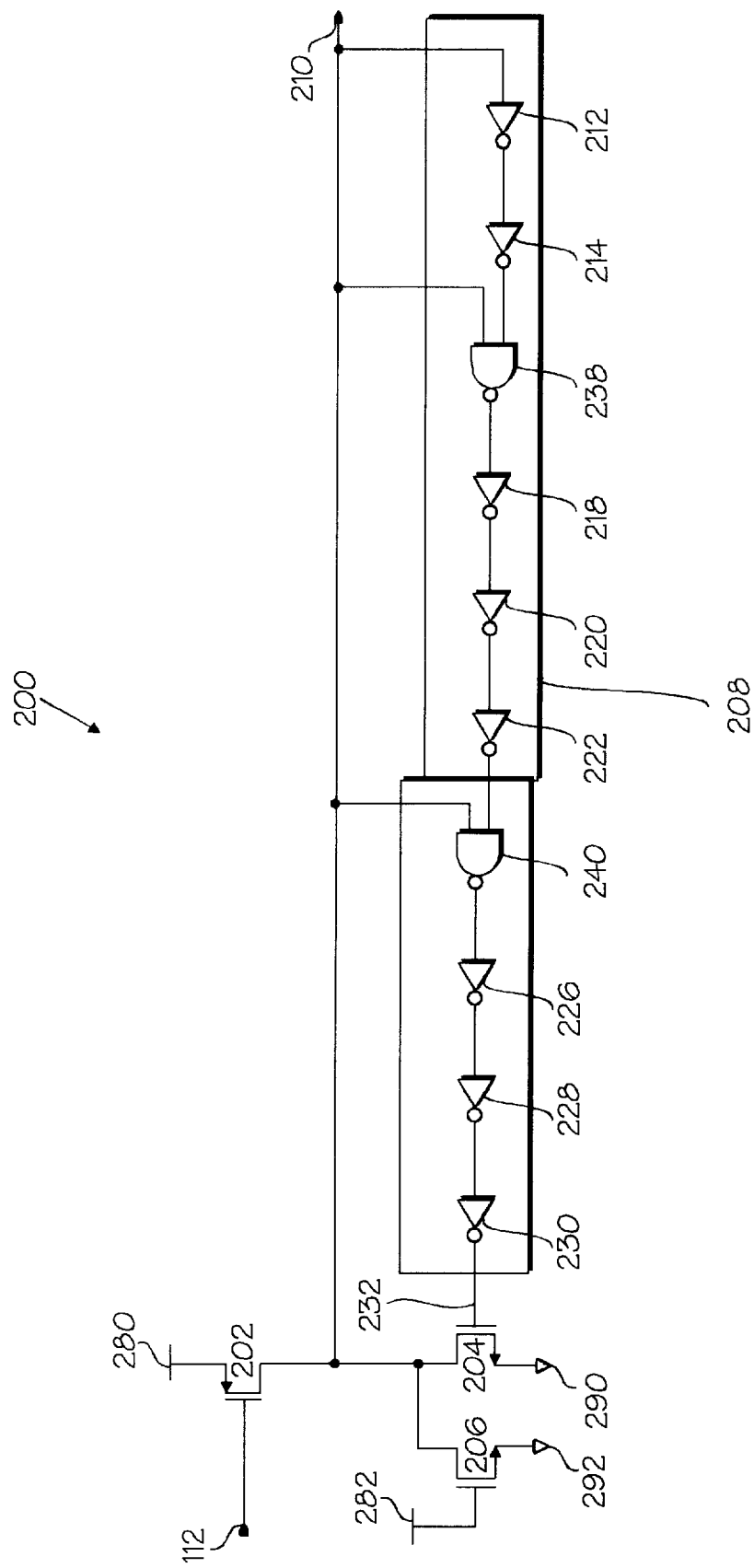
FIG. 13 illustrates, for another embodiment, circuitry for a QRR self-resetting logic stage having a QRR reset chain.

FIG. 12 illustrates, for one embodiment, circuitry for a quick reset recovery (QRR) self-resetting logic stage 100 having a QRR reset chain 108. FIG. 13 illustrates, for another embodiment, circuitry for a QRR self-resetting logic stage 200 having a QRR reset chain 208.

Quick reset recovery (QRR) stages 100 and 200 of FIGS. 12 and 13 may be configured with other stages, such as those illustrated in FIG. 4 for example, in a digital logic path. QRR stages 100 and 200 serve to reduce the propagation delay by reset chain 108 and 208, respectively, of the reset edge of the output pulse signal. As the self-resetting logic stages of FIG. 4 may limit the cycle time for the logic path by increasing the width of a pulse signal as the pulse signal propagates from stage to stage, QRR stages 100 and 200 of FIGS. 12 and 13 may be used to minimize any increase in cycle time for the logic path.

For quick reset recovery (QRR) stage 100 of FIG. 12, the circuit elements of QRR stage 100 function in substantially the same manner as and are similarly configured as their corresponding elements for stage 100 of FIG. 2. For QRR stage 100, reset chain 108 includes a fan-up chain having inverters 126, 128, and 130 and NOR gate 140 and a pad delay chain having inverters 114, 116, 118, 120, and 122 and NOR gate 138.

For QRR reset chain 108, the output terminals of inverters 114, 118, 120, 126, and 128 are coupled to the input terminals of inverters 116, 120, 122, 128, and 130, respectively. The first input terminal, second input terminal, and output terminal of NOR gate 138 are coupled to the output terminal of inverter 116, output node 112, and the input terminal of inverter 118, respectively. The first input terminal, second input terminal, and output terminal of NOR gate 140 are coupled to the output terminal of inverter 122, output node 112, and the input terminal of inverter 126, respectively. The input terminal of inverter 114 is coupled to output node 112. The output terminal of reset chain 108, node 132, is the output terminal of inverter 130. QRR reset chain 108 provides for a quick reset recovery path for QRR stage 100. QRR reset chain 108 may include other suitable circuitry to provide for a quick reset recovery path for QRR stage 100.

NOR gate 138 outputs a high signal on its output terminal when both input terminals of NOR gate 138 are driven low. NOR gate 138 outputs a low signal on its output terminal when either input terminal of NOR gate 138 is driven high. NOR gate 140 functions similarly as NOR gate 138.

QRR stage 100 is in a static state prior to receiving an input pulse signals on input node 110. Forward transistor 104 and reset transistor 102 are both off for this static state. Output node 112 is held high by weak transistor 106.

When QRR stage 100 receives an input pulse signal on input node 110, forward transistor 104 is turned on by the forward or high-going edge of this input pulse signal and pulls output node 112 low, creating on output node 112 a forward edge for an output pulse signal.

Reset chain 108 propagates the forward or low-going edge on output node 112 to reset transistor 102. Although this forward edge appears on the second input terminals of NOR gates 138 and 140, NOR gates 138 and 140 do not propagate the low-going edge from these second input terminals as the first input terminals of NOR gates 138 and 140 are driven high at this time. This low-going edge is propagated by inverters 114 and 116, NOR gate 138, inverters 118, 120, and 122, NOR gate 140, and inverters 126, 128, and 130 and turns on reset transistor 102. Reset transistor 102 pulls output node 112 high, creating on output node 112 a reset or trailing edge for the output pulse signal. The first input terminals of NOR gates 138 and 140 are driven low as the low-going edge is propagated to reset transistor 102.

Reset chain 108 subsequently propagates the reset or high-going edge on output node 112 to reset transistor 102. This high-going edge appears on the second input terminals of NOR gates 138 and 140. As the first input terminal of NOR gate 140 is driven low at this point, this high-going edge is propagated by NOR gate 140 and inverters 126, 128, and 130, turning off reset transistor 102. As the first input terminal of NOR gate 138 is also driven low at this point, this high-going edge is also propagated by NOR gate 138 and inverters 118, 120, and 122, driving the first input terminal of NOR gate 140 high. This high-going edge is further propagated by inverters 114 and 116, driving the first input terminal of NOR gate 138 high. Weak transistor 106 then continues to hold output node 112 high.

QRR reset chain 108 serves to accelerate the propagation of the reset edge that turns off reset transistor 102, allowing stage 100 to recover from reset relatively earlier and receive a new input pulse signal on input node 110. As the propagation by reset chain 108 of the forward edge of the output pulse signal on output node 112 is preferably greater than that for the reset chain of the preceding stage to help ensure forward transistor 104 and reset transistor 102 are not simultaneously on, the propagation of this forward edge is preferably not accelerated. The propagation of the reset edge by reset chain 108, however, is not limited in this manner and is therefore preferably accelerated to minimize the cycle time for the logic path.

For quick reset recovery (QRR) stage 200 of FIG. 13, the circuit elements of QRR stage 200 function in substantially the same manner as and are similarly configured as their corresponding elements for stage 200 of FIG. 2. For QRR stage 200, reset chain 208 includes a fan-up chain having inverters 226, 228, and 230 and NAND gate 240 and a pad delay chain having inverters 212, 214, 218, 220, and 222 and NAND gate 238.

For QRR reset chain 208, the output terminals of inverters 212, 218, 220, 226, and 228 are coupled to the input terminals of inverters 214, 220, 222, 228, and 230, respectively. The first input terminal, second input terminal, and output terminal of NAND gate 238 are coupled to the output terminal of inverter 214, output node 210, and the input terminal of inverter 218, respectively. The first input terminal, second input terminal, and output terminal of NAND gate 240 are coupled to the output terminal of inverter 222, output node 210, and the input terminal of inverter 226, respectively. The input terminal of inverter 212 is coupled to output node 210. The output terminal of reset chain 208, node 232, is the output terminal of inverter 230. QRR reset chain 208 provides for a quick reset recovery path for QRR stage 200. QRR reset chain 208 may include other suitable circuitry to provide for a quick reset recovery path for QRR stage 200.

NAND gate 238 outputs a low signal on its output terminal when both input terminals of NAND gate 238 are driven high. NAND gate 238 outputs a high signal on its output terminal when either input terminal of NAND gate 238 is driven low. NAND gate 240 functions similarly as NAND gate 238.

Figure 14:
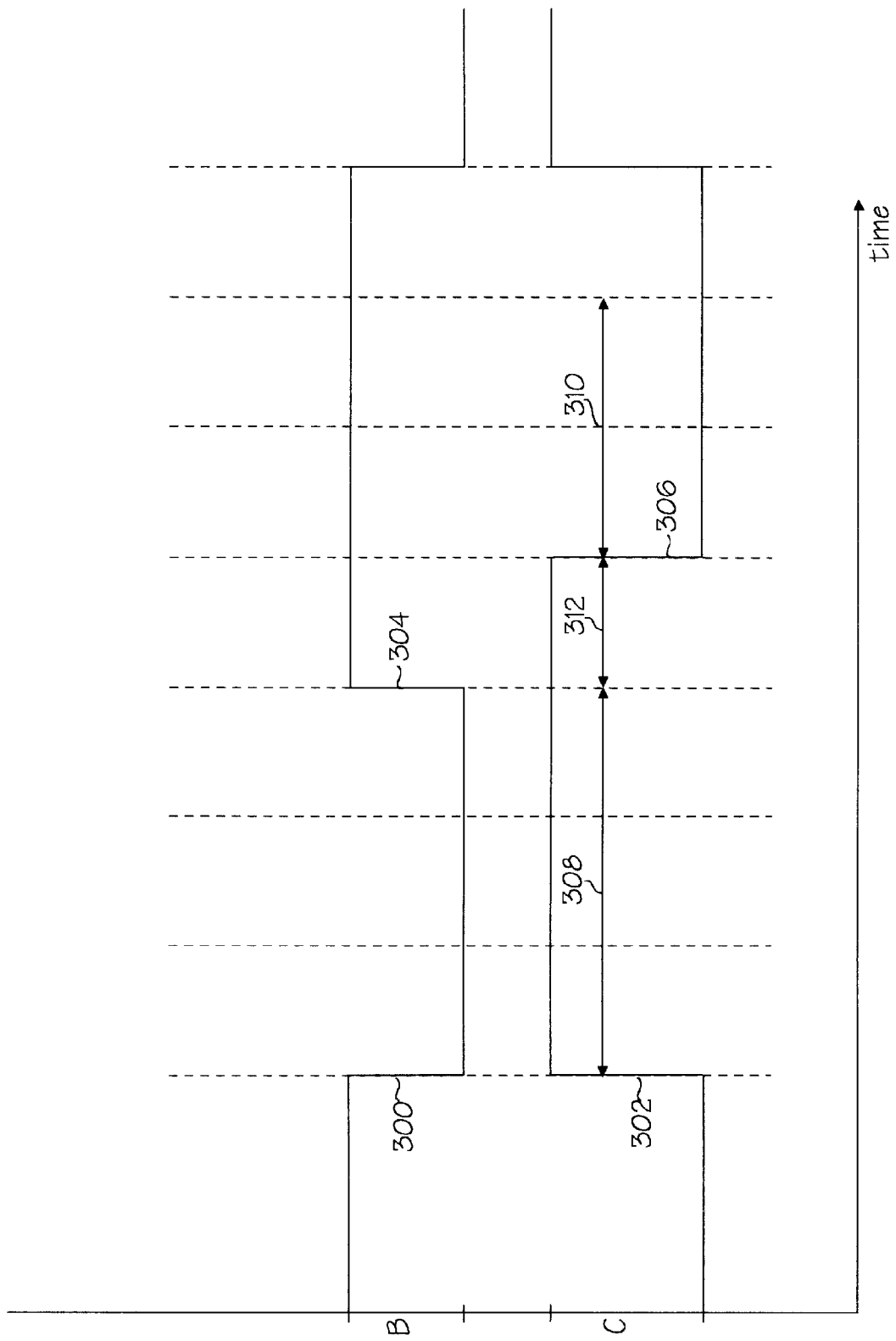
FIG. 14 illustrates a waveform diagram for the circuitry of FIG. 13.

FIG. 14 illustrates a waveform diagram for the circuitry of FIG. 13. Waveforms B and C represent signals on node 112 and output node 210, respectively. Waveforms B and C of FIG. 14 correspond to waveforms B and C as illustrated in FIG. 5.

QRR stage 200 is in a static state prior to receiving an input pulse signals on node 112 (waveform B). Forward transistor 202 and reset transistor 204 are both off for this static state. Output node 210 (waveform C) is held low by weak transistor 206.

When stage 200 receives an input pulse signal on node 112 (waveform B), forward transistor 202 is turned on by a forward or low-going edge 300 of this input pulse signal and pulls output node 210 high, creating on output node 210 (waveform C) a forward edge 302 for an output pulse signal.

Reset chain 208 propagates forward or high-going edge 302 to reset transistor 204. Although high-going edge 302 appears on the second input terminals of NAND gates 238 and 240, NAND gates 238 and 240 do not propagate high-going edge 302 from these second input terminals as the first input terminals of NAND gates 238 and 240 are driven low at this time. Forward or high-going edge 302 is propagated by inverters 212 and 214, NAND gate 238, inverters 218, 220, and 222, NAND gate 240, and inverters 226, 228, and 230 to reset transistor 204. Reset transistor 204 is turned on by forward edge 302 and pulls output node 210 low, creating on output node 210 (waveform C) a reset or trailing edge 306 for the output pulse signal. The first input terminals of NAND gates 238 and 240 are driven high as high-going edge 302 is propagated to reset transistor 204.

Reset transistor 204 remains on during time period 310 until reset chain 208 propagates reset or low-going edge 306 to reset transistor 204. Low-going edge 306 appears on the second input terminals of NAND gates 238 and 240. As the first input terminal of NAND gate 240 is driven high at this point, low-going edge 306 is propagated by NAND gate 240 and inverters 226, 228, and 230, turning off reset transistor 204. As the first input terminal of NAND gate 238 is also driven high at this point, low-going edge 306 is also propagated by NAND gate 238 and inverters 218, 220, and 222, driving the first input terminal of NAND gate 240 low. Low-going edge 306 is further propagated by inverters 212 and 214, driving the first input terminal of NAND gate 238 low. Weak transistor 206 then continues to hold output node 210 (waveform C) low.

As compared to the reset recovery time for stage 200 of FIG. 4 as represented by time period 310 of FIG. 5, QRR reset chain 208 serves to accelerate the propagation of reset edge 306, as represented by time period 310 of FIG. 14, allowing QRR stage 200 to recover from reset relatively earlier and receive a new input pulse signal on node 112 (waveform B).

QRR reset chains, such as QRR reset chain 108 of FIG. 12 and QRR reset chain of FIG. 13, may be used in every stage for a logic path. The recovery from reset may then be approximately equally as fast in all stages regardless of the number of pad inverters used in each reset chain. The time to recover from reset may depend, for example, on the largest number of inverters between the QRR logic gate, NOR gate 140 or NAND gate 240 for example, and the reset transistor. As QRR reset chains may present an increased load on the output node for a stage, any increased load may be minimized by using pad inverters of minimum size, and thus relatively smaller gates, for QRR reset chains.

Self-resetting logic stages may be configured with a QRR reset chain having any suitable circuitry to provide for a relatively quick reset recovery to minimize any increase in cycle time for a logic path. For other embodiments, a QRR stage, such as QRR stage 100 of FIG. 12 and QRR stage 200 of FIG. 13, may be used to provide for a relatively quick reset recovery for other suitable purposes.

Although self-resetting stages 100 and 200 as discussed above with reference to FIGS. 2 through 14 are configured to function as inverters, the above discussion also applies for self-resetting stages configured to perform other functions, such as a NAND function or a NOR function for example.

Figure 15:
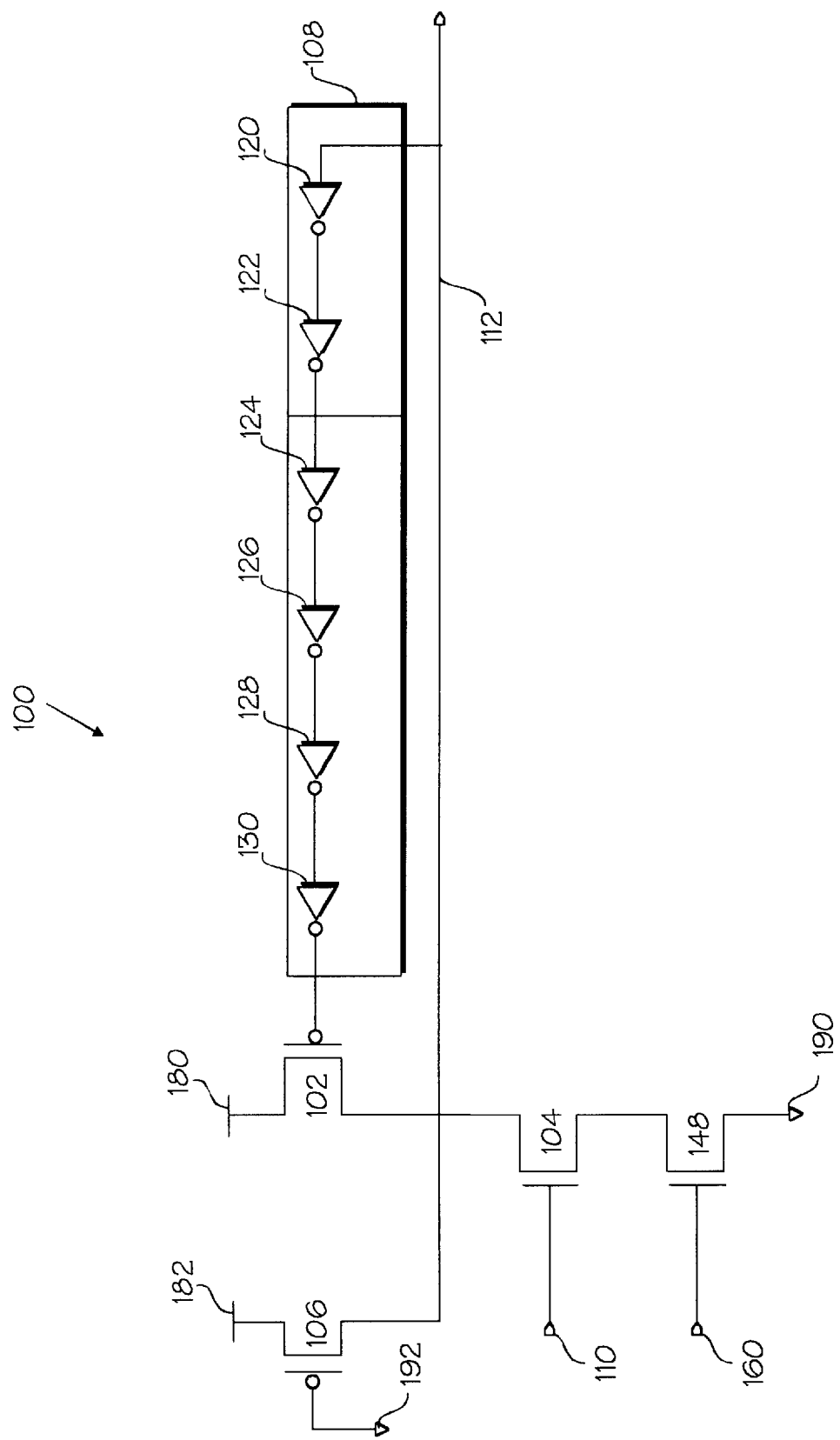
FIG. 15 illustrates, for one embodiment, circuitry for a self-resetting logic stage that functions as a NAND gate.

FIG. 15 illustrates, for one embodiment, circuitry for a self-resetting logic stage 100 that functions as a NAND gate. For other embodiments, stage 100 of FIG. 15 may be implemented with suitable dummy loads, with suitable circuitry to provide for a pulse shrinker (PS) stage, or with suitable circuitry to provide for a quick reset recovery (QRR) stage as discussed above. The above discussion regarding stage 100 similarly applies to NAND stage 100 of FIG. 15.

For NAND stage 100 of FIG. 15, the circuit elements of NAND stage 100 function in substantially the same manner as and are similarly configured as their corresponding elements for stage 100 of FIG. 4. NAND stage 100 of FIG. 15 further includes forward transistor 148 and a second input node 160.

Forward transistor 148 may be an NMOS transistor, for example. Forward transistor 148 is coupled in series between forward transistor 104 and voltage terminal 190. The drain, gate, and source of forward transistor 148 are coupled to the source of forward transistor 104, input node 160, and voltage terminal 190, respectively. Forward transistor 148 couples the source of forward transistor 104 to voltage terminal 190 when input node 160 is driven high.

Stage 100 of FIG. 15 functions as a NAND gate because of the addition of forward transistor 148 in the forward path of the stage. Output node 112 is coupled to voltage terminal 190 and thus pulled low only when both input nodes 110 and 160 are simultaneously driven high, turning on forward transistors 104 and 148, respectively.

Figure 16:
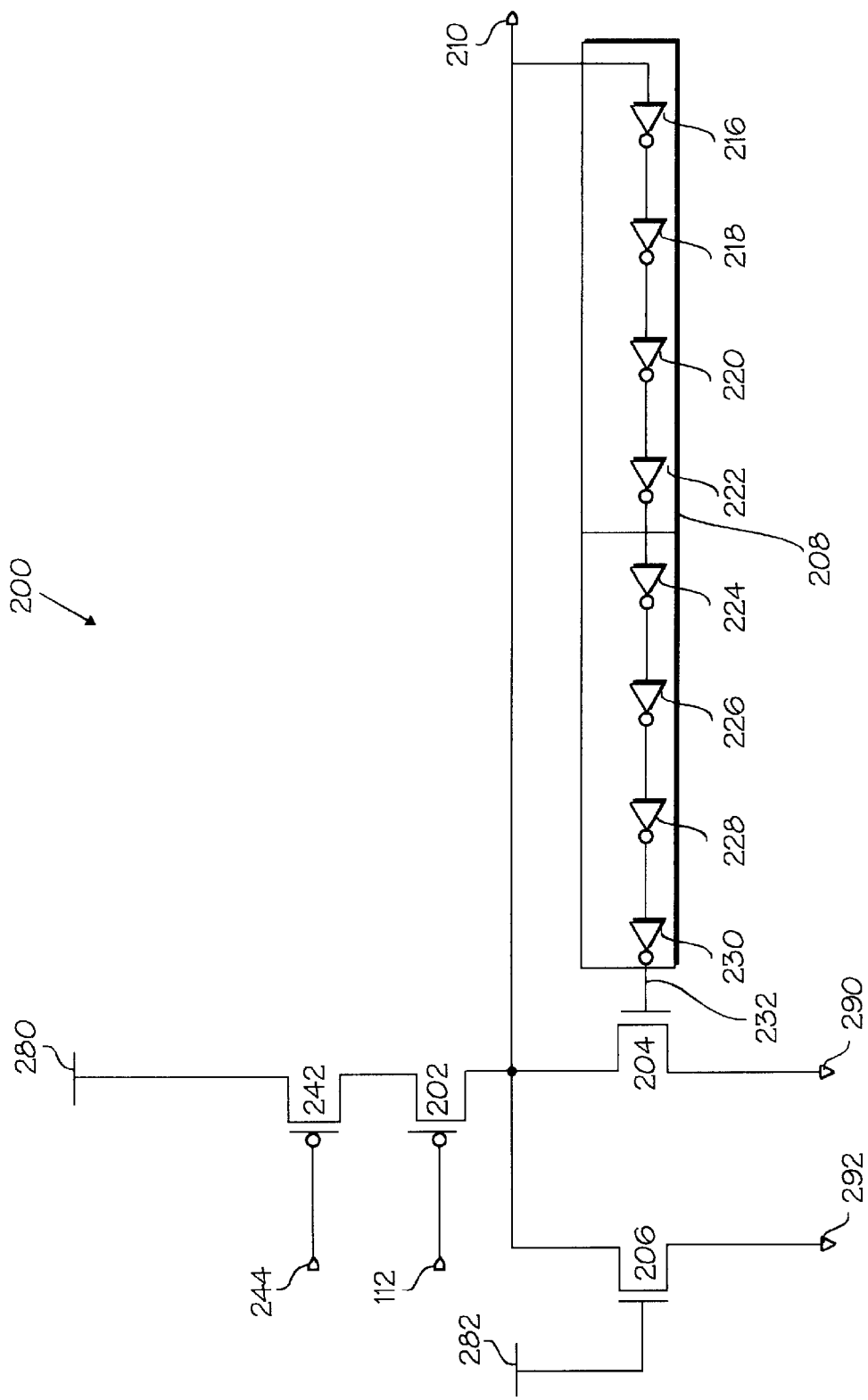
FIG. 16 illustrates, for one embodiment, circuitry for a self-resetting logic stage that functions as a NOR gate.

FIG. 16 illustrates, for one embodiment, circuitry for a self-resetting logic stage 200 that functions as a NOR gate. For other embodiments, stage 200 of FIG. 16 may be implemented with suitable dummy loads, with suitable circuitry to provide for a pulse shrinker (PS) stage, or with suitable circuitry to provide for a quick reset recovery (QRR) stage as discussed above. The above discussion regarding stage 200 similarly applies to stage 200 of FIG. 16.

For stage 200 of FIG. 16, the circuit elements of NOR stage 200 function in substantially the same manner as and are similarly configured as their corresponding elements for stage 200 of FIG. 4. NOR stage 200 of FIG. 16 further includes forward transistor 242 and a second input node 244.

Forward transistor 242 may be a PMOS transistor, for example. Forward transistor 242 is coupled in series between forward transistor 202 and voltage terminal 280. The drain, gate, and source of forward transistor 242 are coupled to the source of forward transistor 202, input node 244, and voltage terminal 280, respectively. Forward transistor 242 couples the source of forward transistor 202 to voltage terminal 280 when input node 244 is driven low.

Stage 200 of FIG. 16 functions as a NOR gate because of the addition of forward transistor 242 in the forward path of the stage. Output node 210 is coupled to voltage terminal 280 and thus pulled high only when both nodes 112 and 244 are simultaneously driven low, turning on forward transistors 202 and 242, respectively.

In the foregoing description, the invention has been described with reference to specific exemplary embodiments thereof. It will, however, be evident that various modifications and changes may be made thereto without departing from the broader spirit or scope of the present invention as defined in the appended claims. The specification and drawings are, accordingly, to be regarded in an illustrative rather than a restrictive sense.

What is claimed is:

1. A method for propagating a pulse signal through multiple logic stages, comprising the steps of:
   (a) in a first self-resetting logic stage and in response to a first edge of an input pulse signal, generating a first pulse signal having a first pulse width;
   (b) in a second self-resetting logic stage and in response to said first pulse signal, generating a second pulse signal having a second pulse width the same as or greater than said first pulse width; and
   (c) in a third self-resetting logic stage and in response to said second pulse signal, generating a third pulse signal having a third pulse width less than said second pulse width.

2. The method of claim 1, wherein said second pulse width is greater than said first pulse width.

3. The method of claim 1, wherein step (a) further comprises the steps of:
   (1) receiving said first edge of said input pulse signal at an input of said first logic stage;
   (2) generating a first edge of said first pulse signal in response to said first edge of said input pulse signal;
   (3) generating a second edge of said first pulse signal after a first predetermined period of time following said first edge of said first pulse signal at an output of said first logic stage; and
   (4) resetting said first logic stage a second predetermined period of time following said second edge of said first pulse signal.

4. The method of claim 3, wherein step (b) comprises the steps of:
   (5) receiving said first edge of said first pulse signal at an input of said second logic stage;
   (6) generating a first edge of said second pulse signal in response to said first edge of said first pulse signal;
   (7) generating a second edge of said second pulse signal after a third predetermined period of time following said first edge of said second pulse signal at an output of said second logic stage, wherein said third predetermined period of time has a longer duration than said first predetermined period of time; and
   (8) resetting said second logic stage a fourth predetermined period of time following said second edge of said second pulse signal.

5. The method of claim 4, wherein step (c) comprises the steps of:
   (9) receiving said first edge of said second pulse signal at an input of said third stage;
   (10) generating a first edge of said third pulse signal at an output of said third logic stage in response to said first edge of said second pulse signal;
   (11) providing a delayed first edge of said third pulse signal at a node and making said input of said third logic stage nonresponsive to said second pulse signal in response to said delayed first edge of said third pulse signal;
   (12) generating a second edge of said third pulse signal at said output of said third logic stage after a fifth predetermined period of time following said first edge of said third pulse signal;
   (13) providing a delayed second edge of said third pulse signal at said node and making said input of said third logic stage responsive to said second pulse signal in response to said delayed second edge of said third pulse signal; and
   (14) resetting said third logic stage a sixth predetermined period of time following said second edge of said third pulse signal.

6. The method of claim 3, wherein step (3) further comprises the step of propagating said first edge of said first pulse signal through a first even plurality of inverting circuits, and wherein step (4) further comprises the step of propagating said second edge of said first pulse signal through said first even plurality of inverting circuits, and wherein step (7) further comprises the step of propagating said first edge of said second pulse signal through a second even plurality of inverting circuits, and wherein step (8) further comprises the step of propagating said second edge of said second pulse signal through said second even plurality of inverting circuits, and wherein step (12) further comprises the step of propagating said first edge of said third pulse signal through a third even plurality of inverting circuits, and wherein step (14) further comprises the step of propagating said second edge of said third pulse signal through said third even plurality of inverting circuits.

7. The method of claim 6, wherein said first even plurality of inverting circuits has less inverting circuits than said second even plurality of inverting circuits.

8. The method of claim 3, wherein step (3) further comprises the steps of propagating said first edge of said first pulse signal through a first even plurality of inverting circuits and a first even plurality of logic gates, and wherein step (4) further comprises the step of propagating said second edge of said first pulse signal through a subset of said first even plurality of the inverting circuits and a subset of said first even plurality of logic gates, and wherein step (7) further comprises the step of propagating said first edge of said second pulse signal through a second even plurality of inverting circuits and a second even plurality of logic gates, and wherein step (8) further comprises the step of propagating said second edge of said second pulse signal through a subset of said second even plurality of inverting circuits and a subset of said second even plurality of inverting circuits.

9. The method of claim 3 further comprising the steps of:
  (i) receiving said first edge of said input pulse signal by a first transistor;
  (ii) turning "on" said first transistor to couple a first node to a first voltage conduit in response to said first edge of said input pulse signal and generating a first pulse signal at said first node;
  (iii) providing a delayed first edge of said first pulse signal;
  (iv) receiving a second edge of said input pulse signal by said first transistor;
  (v) turning "off" said first transistor to decouple said first node from said first voltage conduit in response to said second edge of said input signal;
  (vi) receiving said delayed first edge of said first pulse signal by a second transistor and turning "on" said second transistor to couple said first node to a second voltage conduit in response to said delayed first edge of said first pulse signal;
  (vii) providing a delayed second edge of said first pulse signal;
  (viii) receiving said delayed second edge of said first pulse signal by said second transistor; and
  (ix) turning "off" said second transistor to decouple said first node from said second voltage conduit in response to said delayed second edge of said first pulse signal.

10. The method of claim 9 further comprising the steps of:
  (i) receiving said first edge of said first pulse signal by a third transistor;
  (ii) turning "on" said third transistor to couple a second node to a second voltage conduit in response to said first edge of said first pulse signal and generating a second pulse signal at said second node;
  (iii) providing a delayed first edge of said second pulse signal;
  (iv) receiving said second edge of said first pulse signal by said third transistor;
  (v) turning "off" said first transistor to decouple said second node from said second voltage conduit in response to said second edge of said first pulse signal;
  (vi) receiving said delayed first edge of said second pulse signal by a fourth transistor and turning "on" said fourth transistor to couple said second node to said first voltage conduit in response to said delayed first edge of said second pulse signal;
  (vii) providing a delayed second edge of said second pulse signal;
  (viii) receiving said delayed second edge of said second pulse signal by said fourth transistor; and
  (ix) turning "off" said fourth transistor to decouple said second node from said first voltage conduit in response to said delayed second edge of said second pulse signal.

11. The method of claim 10 further comprising the steps of:
  (i) turning "on" a gate transistor to couple a fifth transistor to said first voltage conduit;
  (ii) receiving said first edge of said second pulse signal by said fifth transistor;
  (iii) turning "on" said fifth transistor to couple said output of said third logic stage to said first voltage conduit in response to said first edge of said second pulse signal;
  (iv) propagating said first edge of said third pulse signal through a plurality of inverting circuits to provide said delayed first edge of said third pulse signal;
  (v) turning "off" said gate transistor to decouple said fifth transistor from said first voltage conduit in response to said delayed first edge of said third pulse signal;
  (vi) stabilizing a voltage of said third pulse signal at said output of said third logic state by a sixth transistor;
  (vii) turning "on" a seventh transistor to couple said output of said third logic stage to said second voltage conduit;
  (viii) propagating said second edge of said third pulse signal through said plurality of inverting circuits to provide said delayed second edge of said third pulse signal;
  (ix) turning "on" said gate transistor to couple said fifth transistor to said first voltage conduit in response to said delayed second edge of said third pulse signal;
  (x) stabilizing said voltage at said output of said third logic stage by said sixth transistor;
  (xi) turning "off" said seventh transistor to decouple said output of said third logic stage from said second voltage conduit.

12. An apparatus for propagating a pulse signal through multiple logic stages, comprising:
  (a) a first self-resetting logic stage having an input and an output, said first logic stage including a first input circuit coupled to said input of said first logic stage, a first delay circuit, a first reset circuit, and a first stabilizing circuit coupled to said output of said first logic stage, said first logic stage configured to receive a first edge of a pulse signal and to output an inverted second pulse signal having a first pulse width;
  (b) a second self-resetting logic stage having an input and an output, said input of said second logic stage being coupled to said output of said first logic stage, said second logic stage including a second input circuit coupled to said input of said second logic stage, a second delay circuit, a second reset circuit, and a second stabilizing circuit coupled to said output of said second logic stage, said second logic stage configured to receive said inverted second pulse signal and to output an inverted third pulse signal having a second pulse width which is the same as or greater than said first pulse width of said inverted second pulse signal; and
  (c) a third self-resetting logic stage having an input and an output, said input of said third logic stage being coupled to said output of said second logic stage, said second logic stage including a third input circuit coupled to said input of said third logic stage, a third delay circuit, a third reset circuit, a third stabilizing circuit coupled to said output of said third logic stage, and a gate circuit coupled between said third input circuit and said third delay circuit, said third logic stage configured to receive said inverted third pulse signal and to output an inverted fourth pulse signal having a third pulse width which is shorter than said second pulse width of said inverted third pulse signal.

13. The apparatus of claim 12, wherein said first input circuit, said third input circuit, and said second reset circuit are NMOS FET transistors, and said second input circuit, said first reset circuit, and said third reset circuit are PMOS FET transistors.

14. The apparatus of claim 13, wherein said gate circuit is an NMOS FET transistor.

15. The apparatus of claim 12, wherein said first delay circuit includes a first plurality of inverting circuits providing a first predetermined delay and said second delay circuit includes a second plurality of inverting circuits providing a second predetermined delay wherein said second predetermined delay is longer than said first predetermined delay.

16. The apparatus of claim 15, wherein said third delay circuit includes a third plurality of inverting circuits, said third delay circuit includes a third plurality of inverting circuits providing a third predetermined delay, wherein said third predetermined delay is shorter than said second predetermined delay.

17. The apparatus of claim 14, wherein said first input circuit includes a gate terminal coupled to said input of said first logic stage, a source terminal coupled to a first voltage terminal, and a drain terminal coupled to an input of said first delay circuit, said reset circuit includes a gate terminal coupled to an output of said first delay circuit, a source terminal coupled to a second voltage terminal, and a drain terminal coupled to said drain terminal of said first input circuit, said stabilizing circuit includes a gate terminal coupled to said first voltage terminal, a source terminal coupled to said second voltage terminal, and a drain terminal coupled to said drain terminal of said reset circuit, wherein said second input circuit includes a gate terminal coupled to said input of said second logic stage, a source terminal coupled to said second voltage terminal, and a drain terminal coupled to an input of said second delay circuit, said reset circuit includes a gate terminal coupled to an output of said second delay circuit, a source terminal coupled to said first voltage terminal, and a drain terminal coupled to said drain terminal of said second input circuit, said stabilizing circuit includes a gate terminal coupled to said second voltage terminal, a source terminal coupled to said first voltage conduit, and a drain terminal coupled to said drain terminal of said reset circuit, wherein said third input circuit includes a gate terminal coupled to said input of said third logic stage, a source terminal coupled to said first voltage terminal via said gate circuit, and a drain terminal coupled to an input of said third delay circuit, said reset circuit includes a gate terminal coupled to an output of said third delay circuit, a source terminal coupled to said second voltage terminal, and a drain terminal coupled to said drain terminal of said third input circuit, said stabilizing circuit includes a gate terminal coupled to said first voltage terminal, a source terminal coupled to said second voltage terminal, and a drain terminal coupled to said drain terminal of said reset circuit.

18. The apparatus of claim 14, wherein said first input circuit includes a gate terminal coupled to said input of said first logic stage, a source terminal coupled to a first voltage terminal, and a drain terminal coupled to an input of said first delay circuit, said reset circuit includes a gate terminal coupled to an output of said first delay circuit, a source terminal coupled to a second voltage terminal, and a drain terminal coupled to said drain terminal of said first input circuit, said stabilizing circuit includes a gate terminal coupled to said first voltage terminal, a source terminal coupled to said second voltage terminal, and a drain terminal coupled to said drain terminal of said reset circuit, wherein said second input circuit includes a gate terminal coupled to said input of said second logic stage, a source terminal coupled to said second voltage terminal, and a drain terminal coupled to an input of said second delay circuit, said reset circuit includes a gate terminal coupled to an output of said second delay circuit, a source terminal coupled to said first voltage terminal, and a drain terminal coupled to said drain terminal of said second input circuit, said stabilizing circuit includes a gate terminal coupled to said second voltage terminal, a source terminal coupled to said first voltage conduit, and a drain terminal coupled to said drain terminal of said reset circuit, wherein said third input circuit includes a gate terminal coupled to said input of said third logic stage, a source terminal coupled to said first voltage terminal via said gate circuit, and a drain terminal coupled to an input of said third delay circuit, said reset circuit includes a gate terminal coupled to an output of said third delay circuit, a source terminal coupled to said second voltage terminal, and a drain terminal coupled to said drain terminal of said third input circuit, said stabilizing circuit includes a gate terminal coupled to said first voltage terminal, a source terminal coupled to said second voltage terminal, and a drain terminal coupled to said drain terminal of said reset circuit.

* * * * *